US009006016B2

(12) United States Patent
Celik-Butler et al.

(10) Patent No.: US 9,006,016 B2
(45) Date of Patent: Apr. 14, 2015

(54) METHOD AND APPARATUS FOR FABRICATING PIEZORESISTIVE POLYSILICON BY LOW-TEMPERATURE METAL INDUCED CRYSTALLIZATION

(71) Applicant: Board of Regents, The University of Texas System, Austin, TX (US)

(72) Inventors: Zeynep Celik-Butler, Colleyville, TX (US); Suraj K. Patil, Ballston Lake, NY (US); Donald Philip Butler, Colleyville, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 159 days.

(21) Appl. No.: 13/925,563

(22) Filed: Jun. 24, 2013

(65) Prior Publication Data

US 2014/0091410 A1    Apr. 3, 2014

Related U.S. Application Data

(62) Division of application No. 12/541,907, filed on Aug. 14, 2009, now Pat. No. 8,492,238.

(60) Provisional application No. 61/088,820, filed on Aug. 14, 2008.

(51) Int. Cl.
*H01L 21/00*    (2006.01)
*H01L 21/20*    (2006.01)
(Continued)

(52) U.S. Cl.
CPC .......... *H01L 41/1132* (2013.01); *G01L 9/0042* (2013.01); *G01L 9/0054* (2013.01);
(Continued)

(58) Field of Classification Search
CPC .. H01L 41/1132; H01L 41/25; H01L 41/1138
USPC ........... 438/51, 381, 647, 684; 257/E21.158, 257/E29.324, E21.211
See application file for complete search history.

(56) References Cited

U.S. PATENT DOCUMENTS 5,892,246 A    4/1999 Tsai et al.
6,022,458 A    2/2000 Ichikawa
(Continued)

OTHER PUBLICATIONS

R. Proksch, "Nondestructive Added Mass Spring Calibration with the MFD-3DTM: Technical Note," www.asylumresearch.com, 2 pages.
(Continued)

*Primary Examiner* — David S Blum
(74) *Attorney, Agent, or Firm* — Daniel J. Chalker; Chalker Flores, LLP

(57) ABSTRACT

The present invention provides a method and apparatus for fabricating piezoresistive polysilicon on a substrate by low-temperature metal induced crystallization by: (1) providing the substrate having a passivation layer; (2) performing, at or near room temperature in a chamber without breaking a vacuum or near-vacuum within the chamber, the steps of: (a) creating a metal layer on the passivation layer, and (b) creating an amorphous silicon layer on the metal layer, wherein the metal layer and the amorphous silicon layer have approximately the same thickness; (3) annealing the substrate, the passivation layer, the metal layer and the amorphous silicon layer at a temperature equal to or less than 600° C. and a period of time equal to or less than three hours to form a doped polysilicon layer below a residual metal layer; and (4) removing the residual metal layer to expose the doped polysilicon layer.

31 Claims, 21 Drawing Sheets

(51) Int. Cl.
H01L 21/4763 (2006.01)
H01L 21/44 (2006.01)
H01L 41/113 (2006.01)
G01L 9/00 (2006.01)
H01L 21/02 (2006.01)
H01L 21/324 (2006.01)
H01L 41/25 (2013.01)

(52) U.S. Cl.
CPC ...... *H01L21/0237* (2013.01); *H01L 21/02488* (2013.01); *H01L 21/02491* (2013.01); *H01L 21/02532* (2013.01); *H01L 21/02672* (2013.01); *H01L 21/324* (2013.01); *H01L 41/1138* (2013.01); *H01L 41/25* (2013.01)

(56) References Cited

U.S. PATENT DOCUMENTS

| | | | |
|---|---|---|---|
| 6,987,050 | B2 | 1/2006 | Cabral, Jr. et al. |
| 7,202,143 | B1 | 4/2007 | Naseem et al. |
| 2008/0026547 | A1 | 1/2008 | Yin et al. |
| 2008/0048291 | A1 | 2/2008 | Chung et al. |
| 2009/0176018 | A1 | 7/2009 | Zou et al. |

OTHER PUBLICATIONS

Richter, J., et al., "Piezoresistance of silicon and strained Si0.9Ge0.1," Sensors and Actuators A 123-124:388-396 (2005).
Sands, D., et al., "Excimer laser recrystallization of amorphous silicon investigated by normal incidence spectral reflectivity," Semicond. Sci. Technol. 12:750-754 (1997).
Sarikov, A., et al., "A model of preferential (100) crystal orientation of Si grains grown by aluminium-induced layer-exchange process," Thin Solid Films 515:7465-7468 (2007).
Shamanna, V., et al., "Micromachined integrated pressure-thermal sensors on flexible substrates," J. Micromech. Microeng. 16:1984-1992 (2006).
Shetty, P.K., et al., "Formation and characterization of silicon films on flexible polymer substrates," Materials Letters 59:872-875 (2005).
Shirafuji, J., "Morphological fluctuation and electrical properties of sputtered hydrogenated silicon," Appl. Phys. Lett. 41:535-537 (1982).
Sieber, I., "Preparation of thin polycrystalline silicon films on glass by aluminium-induced crystallisation—an electron microscopy study," Thin Solid Films 427:298-302 (2003).
Smith, P. M., et al., "Excimer laser crystallization and doping of silicon films on plastic substrates," Appl. Phys. Lett. 70:342-344 (1997).
Stoffel, A., et al., "LPCVD against PECVD for micromechanical applications," J. Micromech. Microeng. 6:1-13 (1996).
Tamborin, M., "Piezoresistive properties of RuO2-based thick-film resistors: the effect of RuO2 grain size," Sensors and Actuators A 58:159-164 (1997).
Thaysen, J., et al., "Su-8 Based Piezoresistive Mechanical Sensor," 15th Intl. Conf. MEMS pp. 320-323 (2002).
Valdastri, P., et al., "Characterization of a novel hybrid silicon three-axial force sensor," Sensors and Actuators A 123-124:249-257 (2005).
Van Gestel, D., et al., "Influence of seed layer morphology on the epitazial growth of polycrystalline-silicon solar cells," Thin Solid Films 511-512:35-40 (2006).
Vanlandingham, M. R., et al., "Relating elastic modulus to indentation response using atomic force microscopy," Journal of Materials Science Letters 16:117-119 (1997).
Vijayalakshmi, S., et al., "Characterization of laser ablated silicon thin films," Thin Solid Films 339:102-108 (1999).
Voutsas, T., "Low Temperature Polysilicon Technology for Advanced Display Systems," Polysilicon Tech. for Advanced Display Systems (1997).

Wang, L., Beebe, D. J., "Characterization of Silicon-Based Shear-Force Sensor on Human Subjects," IEEE Transactions of Biomedical Engineering 49:1340-1347 (2002).
Wang, C.M., et al., "Electrical and piezorsistive properties of TaN—Cu nanocomposite thin films," Thin Solid Films 469-470:455-459 (2004).
Widenborg, P. I., Aberle, A. G., "Surface morphology of poly-Si films made by aluminium-induced crystallisation on glass substrates," Journal of Crystal Growth 242:270-382 (2002).
Wisitsoraat, A., et al., "Low cost thin film based piezoresistive MEMS tactile sensor," Sensors and Actuators A 139:17-22 (2007).
Wortman, J.J., Evans, R.A., "Young's Modulus, Shear Modulus, and Poisson's Ration in Silicon and Germanium," Journal of Applied Physics 36:153-156 (1965).
Xu, K., et al., "Surface analysis of the initial stages of Si film growth," Materials Science and Engineering B 108:281-285 (2004).
Yamamoto, A., et al., "Pressure sensor using p-type polycrystalline diamond piezoresistors," Diamond & Related Materials 14:657-660 (2005).
Yang, S-C, et al., "Preparation of Polycrystalline Silicon Thin Films by Pulsed Ion-Beam Evaporation," IEEE Transactions of Plasma Science 30:1816-1819 (2002).
Abe, T., Reed, M. L., "Low Strain Sputtered Polysilicon for Micromechanical Structures," IEEE Proceddings MEMS' (1996) pp. 258-262.
Cao, L., et al., "Simulation and fabrication of piezoresistive membrane type MEMS strain sensors," Sensors and Actuators 80:273-279 (2000).
H. Chelawat, A. Kumbhar, S. Adhikari, H. Kelkar, R. O. Dusane, Low temperature Aluminum induce crystallization process to bet Polysilicon films for thin film transistor application in active matrix displays, Proc. of ASID Oct. 8-12, 2006, New Delhi (2006).
Chiriac, H., et al., "Ni—Ag thin films as strain-sensitive materials for piexoresistive sensors," Sensors and Actuators 76:376-380 (1999).
Cleveland, J.P., et al., "A nondestructive method for determining the spring constant of cantilevers for scanning force microscopy," Rev. Sci. Instrum. 64(2):403-405 (1993).
A. Daire, "Low-Voltage Measurement Techniques: Application Note," www.keithley.com, Oct. 2005, 8 pages.
Dimova-Malinovska, D., et al., "Polycrystalline silicon thin films on glass substrate," Thin Solid Films 451-542:303-307 (2004).
Dimova-Malinovska, D., et al., "Investigation of structural properties of poly-Si thin films obtained by aluminium induced crystallization in different atmospheres," Thin Solid Films 501:358-361 (2006).
Edwards, W.D., Beaulieu, R. P., "Germanium piezoresistive element on a flexible substrate," Journal of Scientific Instruments 2:613-615 (1969).
Ekanayake, G., et al., "Large-grained poly-silicon thin films by aluminium-induced crystallisation of microcrystallin silicon," Journal of Crystal Growth 293:351-358 (2006).
Ekanayake, G., Reehal, H.S., "Poly-silicon thin films by aluminium induced crystallisation of microcrystalline silicone," Vacuum 81:272-278 (2006).
Engel, J., et al., "Development of polyimide flexible tactile sensor skin," J. Micromech. Microeng. 13:359-366 (2003).
French, P.J., Evans, A. G. R., "Piezoresistance in Polysilicon and it's applications to strain gauges," Solid-State Electronics 32:1-10 (1989).
French, P.J., "Polysilicon: a versatile material for microsystems," Sensors and Actuators A 99:3-12 (2002).
Gall, S., et al., "Aluminum-induced crystallization of amorphous silicon," Journal of Non-Crystalline Solids 299-302:741-745 (2002).
Gall, S., et al., "Polycrystalline Silicon on Glass by Aluminum-Induced Crystallization," 29th IEEE Photovoltaic Specialists Conference 19-24:1202-1205 (2002).
Gall, S., et al., "Large-grained polycrystalline silicon on glass for thin-film solar cells," Thin Solid Films 511-512:7-14 (2006).
Gregory, O. J., You, T., "Stability and Piezoresistive Properties of Indium—Tin—Oxide Ceramic Strain Gages," IEEE Sensors 2:801-806 (2003).
Gu, J-D, Chen, P-L, "Direct fabrication of large-grain polycrystalline silicone thin films by RF-biased RF-PECVD at low temperature," Thin Solid Films 498:2-8 (2006).

(56) References Cited

OTHER PUBLICATIONS

Gupta, S., et al., "Aluminum-induced in situ crystallization of HWCVD a-Si:H Films," Thin Solid Films 516:850-852 (2008).

W. Han, "Force Spectroscopy with the Atomic Force Microscope: Application Note," www. agilent.com, 8 pages.

Hague, M. S., et al., "Interaction of aluminum with hydrogenated amorphous silicon at low temperatures," J. Appl. Phys. 75:3928-3935 (1994).

Hatano, M., et al., "Excimer laser-induced temperature field in melting and resolidification of silicon thin films," Journal of Applied Physics 87:36-43 (2000).

He, D., et al., "Reaction between amporphous Si and crystalline Al in Al/Si and Si/Al bilayers: microstructural and thermodynamic analysis of layer exchange," Appl. Phys. A 80:501-509 (2005).

He, D., et al., "Origins of interdiffusion, crystallization and layer exchange in crystalline Al/amorphous Si layer systems," Applied Surface Science 252:5470-5473 (2006).

R. He, P. Yang, "Giant Piezoresistance Effect in Silicon Nanowires," Nature Nanotechnol. Letts. 1, 42 (2006), 5 pages.

Hodges, C.S., "Measuring forces with the AFM: polymeric surfaces in liquids," Advances in Colloid and Interface Science, 99:13-75 (2002).

Jang, Y. H., et al., "Low-Temperature Polycrystalline Silicon Desposition by Very High Frequency Sputtering Using Ar and H2," J. Electrochem. Soc. 144:3973-3978.

Jiang, W., et al., "Pulsed Ion-Beam Evaporation for Material Applications," IEEE Pulsed Power Plasma Sci. 376-379 (2001).

Kane, B. J., et al., "CMOS-compatible traction stress sensor for us in high-resolution tactile imaging," Sensors and Actuators A 54:511-516 (1996).

Kane, B. J., et al., "A Traction Stress Sensor Array for Use in High-Resolution Robotic Tactile Imaging," Journal of Microelectromechanical Systems 9:425-434 (2000).

Kim, H., et al., "Polycrystalline Si films formed by Al-induced crystallization (AIC) with and without Al oxides at Al/a-Si interface," Solar Energy Materials & Solar Cells 74:323-329 (2002).

J. Klein, J. Schneider, M. Muske, S. Gall, W. Fuhs, "Aluminum-induced crystallization of amorphous silicon: the influence of the aluminum layer on the process", 19th European Photovoltaic Solar Energy Conference, Jun. 7-11, 2004, Paris, France.

Le Berre, M., et al., "Piezoresistance of boron-doped PECVD and LPCVD polycrystalline silicon films," Sensors and Actuators A 46-47:166-170 (1995).

Malhaire, C., Barbier, D., "Design of a polysilicon-on-insulator pressure sensor with original polysilicon layout for harsh environment," Thin Solid Films 427:362-366 (2003).

Y. Matsumoto, Z. Yu, Jpn. J. Appl. Phys. 40, 2110 (2001).

Mishima, Y., et al., "Polycrystalline silicon formed by ultrahigh-vacuum sputtering system," J. Appl. Phys. 78:217-223 (1995).

Mosser, V., et al., "Piezoresistive pressure sensors based on polycrystalline silicon," Sensors and Actuators A 28:113-132 (1991).

Nast, O., "Influence of interface and Al structure on layer exchange during aluminum-induced crystallization of amorphous silicon," Journal of Applied Physics 88:716-724 (2000).

Nast, O., Wenham, S. R., "Elucidation of the layer exchange mechanism in the formation of polycrystalline silicon by aluminum-induced crystallization," Journal of Applied Physics 88:124-132 (2000).

Novascan Technologies, Inc., 131 Main Street, Ames, IA 50010, USA, www.novascan.com, 2 pages.

Obermeier, E., Kopystynski, P., "Polysilicon as a material for microsensor applications," Sensors and Actuators A 30:149-155 (1992).

Obieta, I., Gracia, F.J., "Sputtered silicon thin films for piezoresistive pressure microsensors," Sensor and Actuators A 41-42:685-688 (1994).

Ornaghi, C., et al., "Aluminum-induced crystallization of amorphous silicon: influence of materials characteristics on the reaction," Thin Solid Films 451-452:476-480 (2004).

Patil, S. K., et al., "Microcrystalline Piezoresistive Polysilicon Film Obtained by Aluminum Induced Crystallization," 8th IEEE Nanotechnol. Conf. Proceedings 767-770 (2008).

Peiner, E., et al., "Micro force sensor with piezoresistive amorphous carbon strain gauge," Sensors and Actuators A 130-131:75-82 (2006).

Peng, Y. C., et al., "Crystallization of amorphous Si films by pulsed laser annealing and their structural characteristics," Semicond. Sci. Technol. 19:759-763 (2004).

HD Microsystems, "PI-2600 Series-Low Stress Polyimides, Technical Information," HD Microsystems, 250 Cheesequake Road, Parlin, NJ 00859, USA, www.hdmicrosystems.com., Aug. 2010, 3 pages.

Pihan, E., et al., "Growth kinetics and crystallographic properties of polysilicon thin films formed by aluminium-induced crystallization," Journal of Crystal Growth 305:88-98 (2007).

Prater, "Probing Nano-Scale Forces with the Atomic Force Microscope," Digital Instruments, 8 pages.

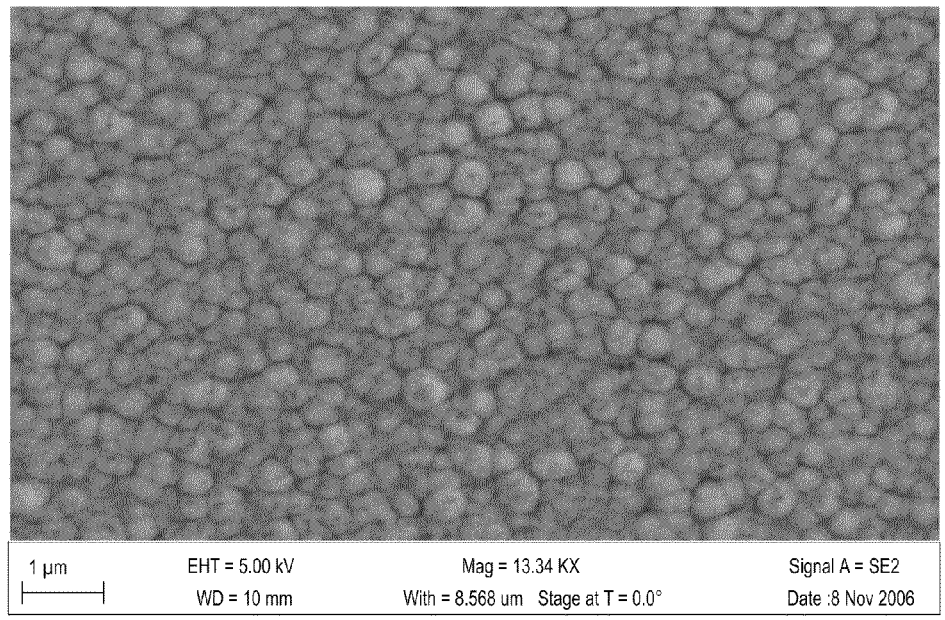
FIG. 5
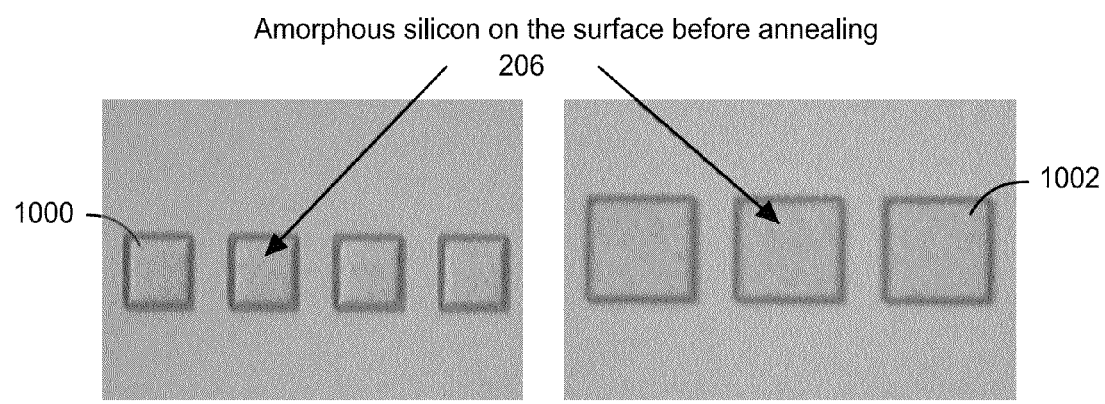
FIG. 10A
FIG. 10B

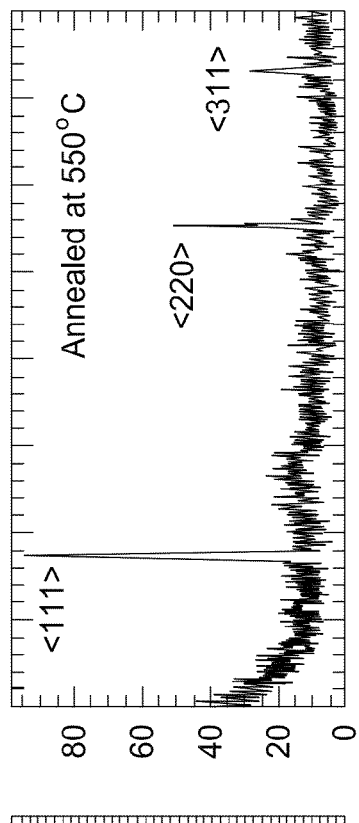
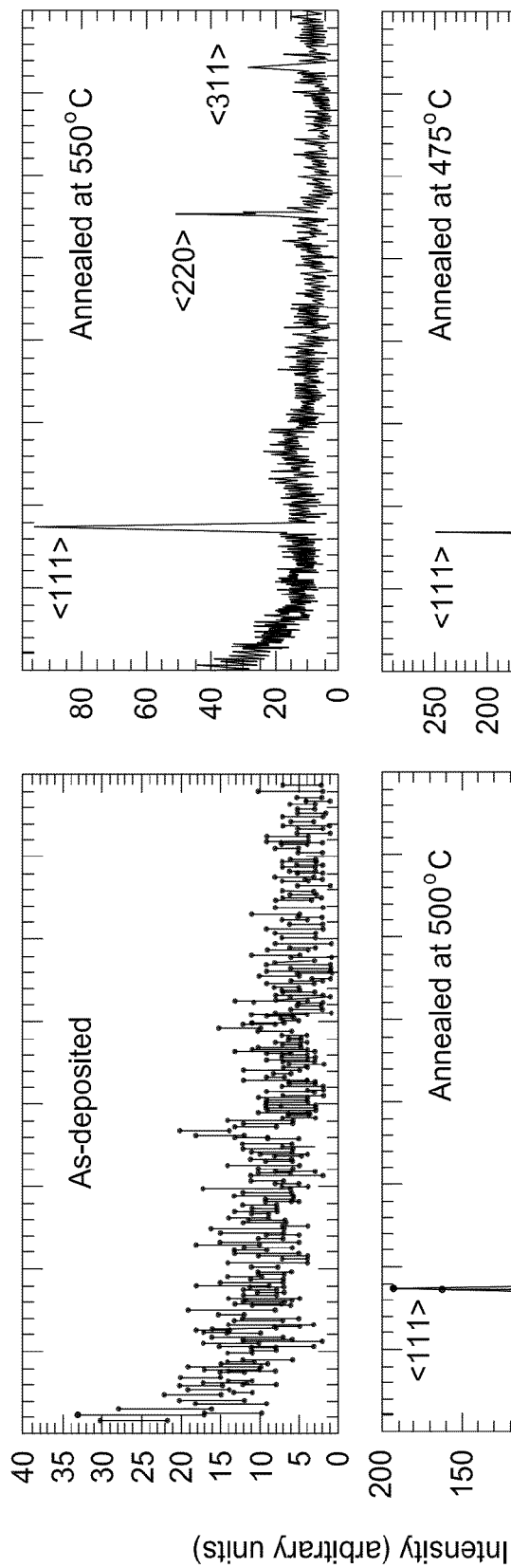
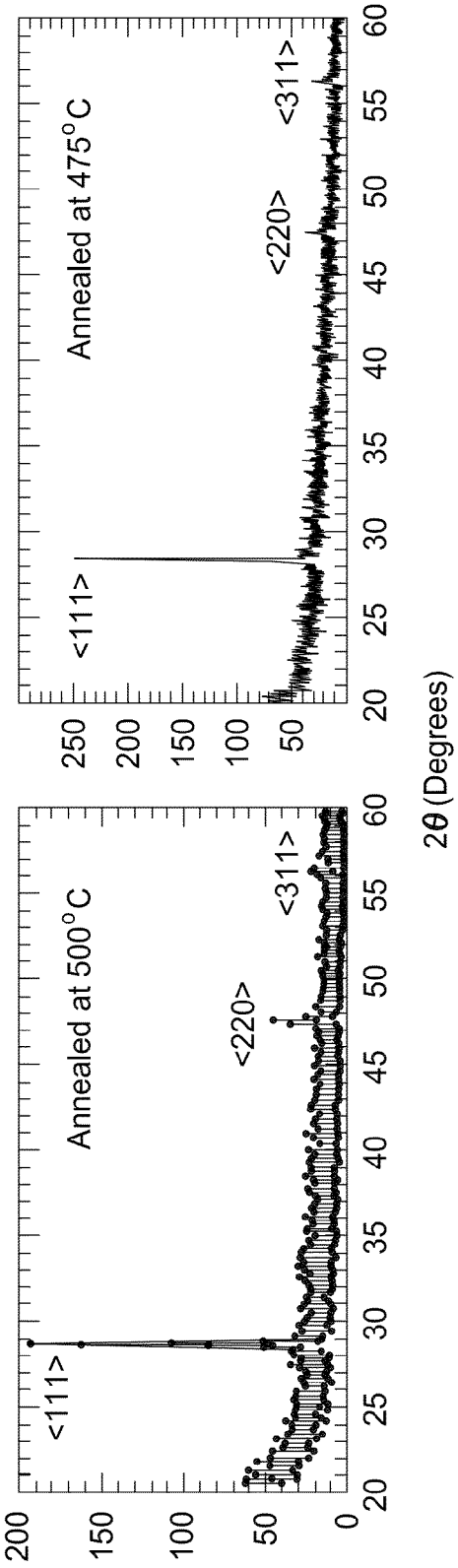
FIG. 6A
FIG. 6B
FIG. 6C
FIG. 6D

| Layer # | Description |
|---|---|
| 1 | Si wafer |
| 2 | $Si_3N_4$ Passivation layer |
| 3 | PI-2611 Flexible Substrate |
| 4 | $Si_3N_4$ Passivation layer |
| 5 | PI-2611 Flexible Substrate |
| 6 | $Si_3N_4$ Diaphragm layer |
| 7 | AIC Polysilicon Piezoresistor |
| 8 | Aluminum -Metal layer |

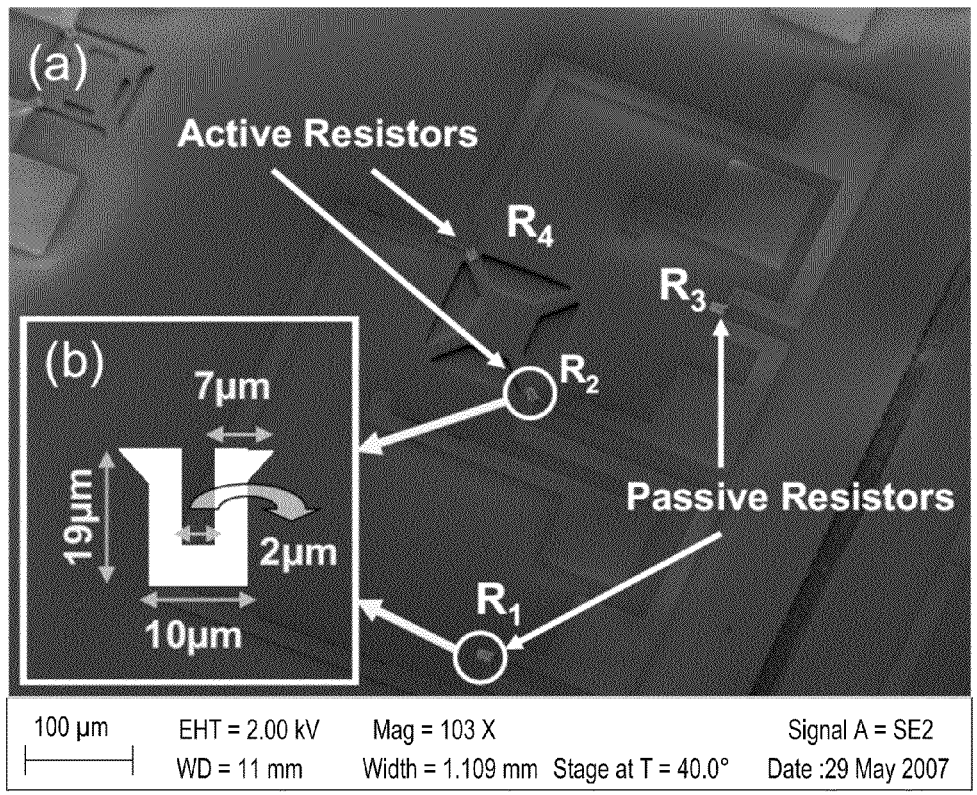
FIG. 19A and 19B (inset)
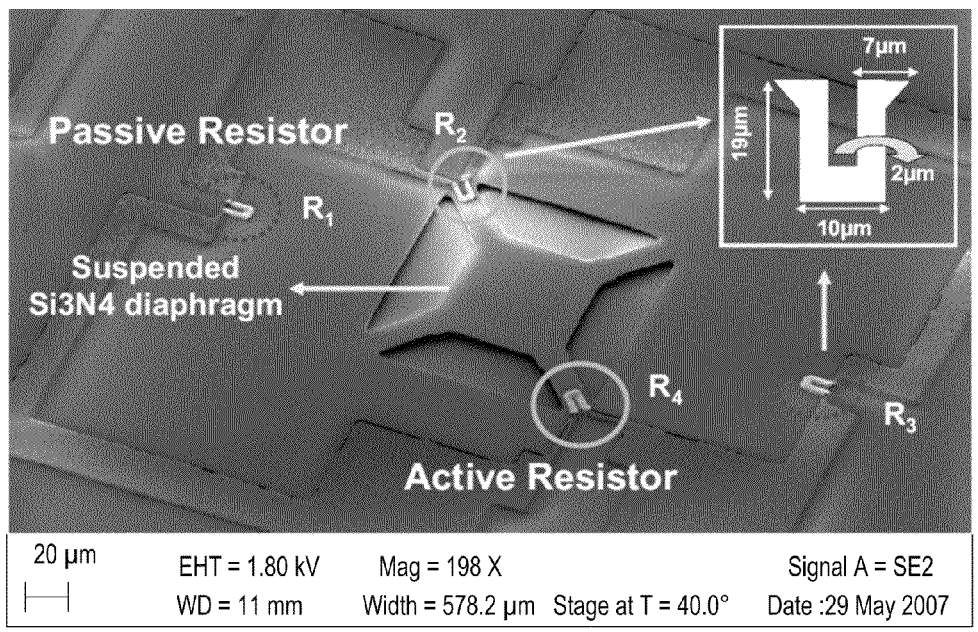
FIG. 24

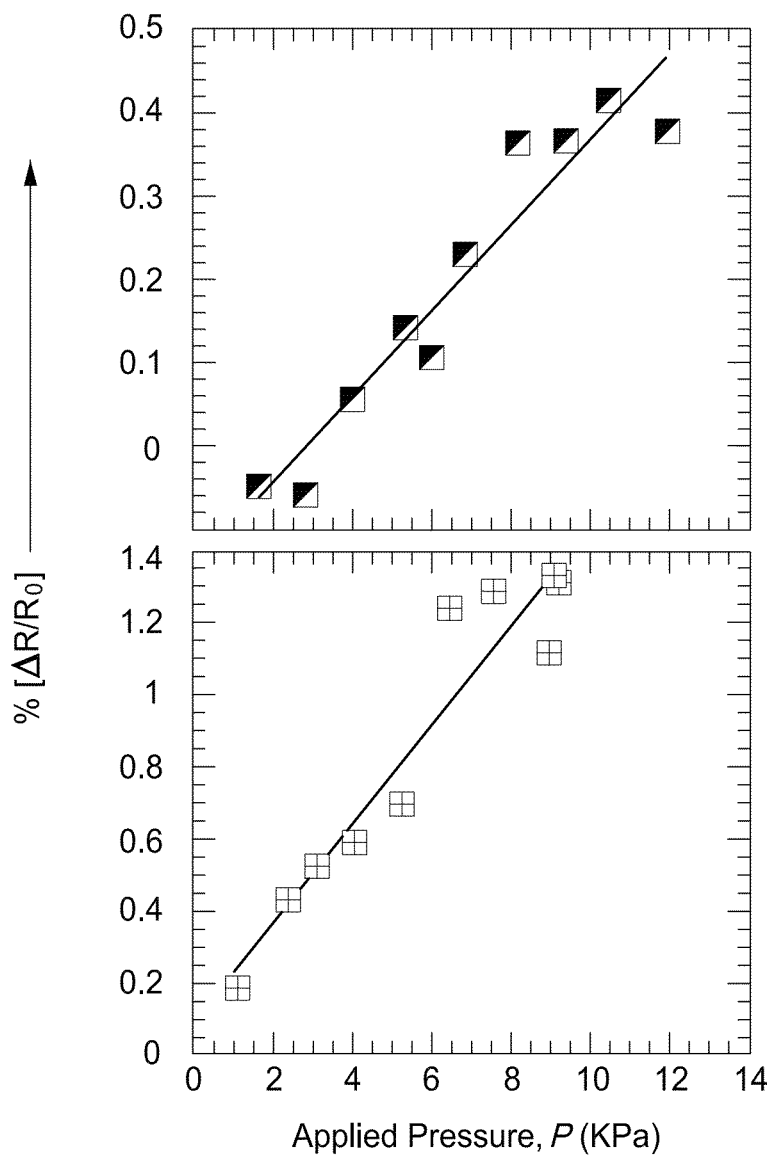
FIG. 26 A&B

METHOD AND APPARATUS FOR FABRICATING PIEZORESISTIVE POLYSILICON BY LOW-TEMPERATURE METAL INDUCED CRYSTALLIZATION

CROSS-REFERENCE TO RELATED APPLICATIONS

This application is a divisional patent application of and claims priority to U.S. patent application Ser. No. 12/541,907 filed on Aug. 14, 2009 entitled "Method and Apparatus for Fabricating Piezoresistive Polysilicon by Low-Temperature Metal Induced Crystallization," which is a non-provisional patent application of and claims priority to U.S. Provisional Patent Application Ser. No. 61/088,820 filed on Aug. 14, 2008, both of which are incorporated herein by reference in their entirety.

STATEMENT OF FEDERALLY FUNDED RESEARCH

This invention was made with U.S. Government support under Contract Nos. ECS-0401148 and FA9550-06-1-0413 awarded by the NSF and the Air Force Office of Scientific Research (AFOSR), respectively. The government has certain rights in this invention.

FIELD OF THE INVENTION

The present invention relates generally to the field of semiconductor processing and devices and, more particularly, to a method and apparatus for fabricating piezoresistive polysilicon by low-temperature metal induced crystallization.

BACKGROUND OF THE INVENTION

Without limiting the scope of the invention, its background is described in connection with the deposition of silicon films by aluminum induced crystallization.

Recently there has been an increasing interest in sensors on flexible substrates towards the development of a 'smart-skin' for simultaneous and real-time sensing of various mechanical, biological and chemical elements. A smart skin would combine multi-sensory arrays with polymer electronics or silicon thin film transistors to sense and process a variety of stimuli. One challenge in fabricating sensors on flexible substrates is the low thermal budget of the flexible substrates, dictating low temperature processing. Polysilicon is widely used as a piezoresistive material for force/pressure sensing applications.

The need for low-temperature deposition of thin films for sensing and other applications is dictated by the trend of shifting from conventional silicon substrates to lower weight, low profile, structurally robust and lower cost flexible substrates. These flexible substrates easily conform to non-planar objects, could be batch fabricated at lower cost and enable multilayer construction. This would eventually evolve into seamless assimilation of sensors for various stimuli onto a single flexible substrate for applications in robotics, prosthetics, surgical instrumentation and industrial diagnostics to name a few.

The sensitivity of the piezoresistive material is defined by its gauge factor (GF), given by [1]:

$$GF = \frac{\Delta R/R}{\varepsilon} \quad (1)$$

where $\Delta R/R$ is the change in resistance of the material when experiencing a unit strain of $\varepsilon$. The gauge factor of the piezoresistive material is highly dependent on its grain size [1]. Larger grain sizes result in higher gauge factors. In order to obtain good quality polysilicon films, LPCVD requires higher deposition temperatures in excess of 600° C. and even higher temperatures for dopant diffusion, to make the resultant film less resistive [62]. These temperatures are too high to be used with flexible polyimide substrates. Although, PECVD provides a low-temperature solution for the problem, the film obtained using this method requires post-deposition annealing temperatures in excess of 700° C. to increase the grain size and improve conductivity [28]. Alternatively, laser ablation is also used to obtain polysilicon films. However, this technique has issues with film contamination and uniformity when trying to deposit over large surfaces.

Different metals and semiconductors have been utilized as piezoresistive materials. Platinum resistors have been placed in series with indium tin oxide (ITO) as a piezoresistive material, achieving GF of 20.9, designed for elevated temperature sensors operating up to 1560° C. [2]. Thin gold films of thickness 40 nm have also been employed as piezoresistors with a GF of 2 to 4 on a SU-8 based mechanical sensor [3]. In addition, thick film resistors comprising of ruthenium oxide powder and glass frit in paste form have been used as a piezoresistive sensing material and GF of 2 to 30 have been achieved [4]. Single crystal diamond shows a very high GF of 2000 but for most applications it is prohibitively expensive. Alternatively, polycrystalline diamond thin films deposited by chemical vapor deposition showed GF of 100. In a particular case, 0.5 micron thick boron doped polycrystalline diamond resistors were implemented to achieve a GF of 22 [5]. For nickel-silver ($Ni_x$—$Ag_{1-x}$) thin films, a GF of 2.2 to 2.4 was demonstrated when x=0.35 [6]. Nichrome (Ni:Cr=80:20) thin film resistors embedded on polyimide showed a lower GF of 1.3 [7]. GF of 4 to 5 have been realized by tantalum nitride-copper (TaN—Cu) nanocomposite thin film resistors with a near zero temperature coefficient of resistance [8]. Strained $Si_{0.9}Ge_{0.1}$ resistors of thickness of 200 nm deposited by MBE showed 30% increase in their piezoresistive coefficient $\pi_{66}$ compared to $\pi_{44}$ of silicon for the doping concentration of $NA=10^{18}$ $cm^{-3}$, thus making it more sensitive than silicon thin film piezoresistors [9]. Thin germanium films were evaporated on Kapton as substrate at low temperatures to achieve a GF of 33 to 42 and as high as 100 [10]. Amorphous carbon layers sputter-deposited at low temperatures (<150° C.) have also been used as strain gauges with a GF between 36 and 46 [11]. Giant piezoresistance effect has been observed in p-type Si nanowires grown along <111> and <110> directions compared to bulk p-type Si enabling its use in nano-electromechanical systems on flexible substrates [12].

Polycrystalline silicon is one of the most widely used piezoresistive thin film materials as well as in other MEMS applications and CMOS technology. In particular, its relatively high gauge factor (GF) value compared to metals, combined with its CMOS process compatibility and availability at a reasonable cost make it very attractive as a piezoresistive material for force and pressure sensing applications. Since polysilicon film constitutes of grains of various sizes separated by grain boundaries. P. J. French et al. [1] gave the GF for a single polysilicon grain as follows:

$$GF = 1 - \sum \frac{S'_{ij}}{S'_{ii}}(1-\delta_{ij}) + \frac{\rho_g \times \pi_{lg}}{\rho_g + \frac{(2w+\delta)\rho_b}{[L-(2w+\delta)]}} + \frac{\rho_b \times \pi_{lb}}{\rho_b + \frac{[L-(2w+\delta)]\rho_g}{(2w+\delta)}} \quad (2)$$

where:
- $S_{ij}'$ and $S_{ii}'$ are compliance coefficients for Si obtained from its elastic coefficients [13];
- $\delta$ is the boundary thickness (nm);
- $\delta_{ij}$ is the Kronecker delta function;
- $\rho_g$ and $\rho_b$ are grain and barrier resistivities, respectively;
- $\pi_{lg}$ and $\pi_{lb}$ are grain and boundary piezoresistive coefficients;
- L is the grain size; and
- w is the barrier width created due to depletion of carriers inside the grain.

Eq. (2) shows that GF is higher for large grain sizes. Hence the sensitivity of the polysilicon film to applied strain increases with increase in its grain sizes.

Fabrication of piezoresistor-based pressure sensors on flexible polyimide substrates is limited by the glass transition temperature of the specific polyimide used, which sets the value for the maximum deposition and/or annealing temperature of the piezoresistive thin film such that the integrity of flexible polyimide substrate is maintained.

Earlier work on polysilicon piezoresistive pressure sensors on silicon substrates involved deposition of polysilicon by Low Pressure Chemical Vapor Deposition (LPCVD) at temperatures of 620° C. and above [14,15,16,17], followed by doping by ion-implantation or diffusion, to achieve specific resistivity Annealing at high temperatures is carried out to activate the dopant, stabilize the polycrystalline material by increasing the grain size and removing lattice damage during doping [18]. However, due to thermal budget restrictions of the flexible substrate material, polysilicon films deposited by LPCVD can not be used.

Another commonly used polysilicon deposition technique is Plasma Enhanced Chemical Vapor Deposition (PECVD). Hydrogenated microcrystalline silicon film at temperature below 400° C. is obtained by PECVD [19]. As the substrate temperature during PECVD deposition is further reduced, the quality of the film degrades and film obtained is amorphous in nature [20]. The resultant film requires silicon dehydrogenation step and crystallization at higher temperatures. In-situ doping of the amorphous silicon is required to obtain conductive layers, followed by annealing at temperatures around 750° C. for electrical activation [20]. This condition also restricts the use of PECVD for deposition of polysilicon on flexible substrate. However, RF-biased RF-inductively coupled PECVD tubular system provides an attractive option for depositing polysilicon with grain sizes up to 80 nm without any post-heat treatment and at temperatures below 77° C. has been reported [21].

Excimer laser annealing [22,23,24,25,26] of amorphous silicon films results in a defect free polysilicon film with large grains. Although this technique is compatible with low-temperature substrates, it has the disadvantages of being expensive, and highly susceptible to variations in the laser beam, which affect the film quality. It also has a narrow operating window dependent on the laser beam spot-size [27] which reduces throughput, and possibly introduces contamination due to the molten silicon layer from the substrate [28,29]. Another method of low-temperature deposition of polysilicon is by laser ablation [30,31]. However, preliminary tests on pulsed laser ablated polysilicon gave a non-uniform film with clusters of silicon islands, which made the patterning of the film difficult.

Another method of depositing amorphous silicon is by conventional DC magnetron sputtering [32,33], which can be a low-temperature process. Nevertheless, in order to obtain a polycrystalline film, the sample is to be subsequently annealed at a higher temperature (>500° C.) which makes this technique incompatible with a plastic substrate or any material with a lower thermal budget. Different methods of annealing such as laser annealing, furnace annealing or rapid thermal annealing can be used for the recrystallization step. [18] However, they require annealing temperatures in excess of 900° C. with anneal times ranging from 15 secs to few hours depending on the method used. RF sputtering at 13.56 Mhz was used to deposit microcrystalline silicon (μcSi:H) with grain sizes of 20 nm at the substrate temperature of 100° C. with argon (Ar) and with partial pressure of less than 40% of hydrogen ($H_2$) gas. The film showed incorporation of hydrogen [34]. Polysilicon was also deposited at substrate temperatures of 470° C. to 490° C. using ultra-high vacuum sputtering system with RF (100 MHz) and sputter gas mixture of Ar+$H_2$. The polysilicon grain sizes obtained were 40 nm. Lower substrate temperature of 300° C. gave the polysilicon grain size of 26 nm. Low temperature deposition of polysilicon was also achieved by a bias-sputtering process in presence of Ar gas, in addition to $H_2$ and mix of $H_2O$, CO and $CO_2$ gases with individual partial pressures of $1.0\times10^{-8}$ Torr or less, and at substrate temperatures ranging from 400° C. to 700° C. The average grain size obtained in this case was 80 nm at the deposition temperature of 550° C. [36]. Y. H. Jang et al. [37] described the deposition of polysilicon at 300° C. using a very high frequency (182.5 MHz) sputtering by capacitively-coupled parallel plate electrodes using Ar and $H_2$ sputter gases. The polysilicon grain sizes obtained in this case was 20 nm. J. Joo described the use of a 2 MHz inductively coupled plasma (ICP) source based ionized magnetron sputtering with optimized Ar:$H_2$ gas flow ratio of 10:6 to obtain polysilicon films at a substrate temperature of 250° C. with grain sizes of 50-70 nm [38]. Pulsed DC magnetron sputtering was used by P. Reinig et al. to deposit poly-Si thin films at the substrate temperature of 450° C. in only Ar environment. The maximum polysilicon grain size obtained was 60 nm [39]. K. Xu et al. deposited polysilicon films at a substrate temperature of 200° C. on thin gold-coated glass and at 140° C. on polyethyleneterephthalate (PET) substrate using DC magnetron sputtering with 5% $H_2$, 10% Kr, and 85% Ar. The polysilicon grain sizes obtained were (95±5) nm [40,41].

None of the cited works above evaluated the piezoresistive properties of the resultant polysilicon films. As a result, there is a need for a low temperature method for fabricating silicon piezoresistors that has a short anneal time, does not require additional annealing or doping and is suitable for flexible substrates.

SUMMARY OF THE INVENTION

The present invention describes a low temperature method for fabricating silicon piezoresistors using aluminum induced crystallization (AIC). The processing technique of the present invention causes an amorphous silicon thin film to form crystalline grains in a short time period without resorting to high-temperature annealing, additional annealing or additional doping. The process results in a polysilicon film having grain sizes of 65-75 nm with simultaneous p-type doping of the film leading to excellent piezoresistive characteristics. In addition, the process is post-CMOS compatible which is key to the fabrication of many sensors including pressure sensors A low temperature fabrication process for piezoresistive polycrystalline silicon (polysilicon) films has been developed for force and pressure sensing applications. The technique has the potential to facilitate the integration of assortment of polycrystalline thin films otherwise requiring high temperature crystallization on a single polyimide substrate with stringent thermal budget requirements. Aluminum induced crystallization of amorphous silicon films was used to obtain patterned, continuous and uniformly grained piezoresistive polysilicon thin films at annealing temperatures of 400° C. to 500° C. for annealing times ranging from 30 minutes to 90 minutes. The sensitivity of a piezoresistive sensor is highly dependent on its gauge factor which in turn, is affected by the grain size of the sensing film. Polysilicon films with grain sizes in the order of 100-150 nm have been obtained by this process. X-ray diffraction spectroscopy confirmed the polycrystalline nature of the resultant silicon thin film. In order to test the piezoresistive properties of the polysilicon films, a prototype consisting of a half-Wheatstone-bridge pressure sensor was fabricated with two passive resistors and two active polysilicon piezoresistors on a surface-micromachined $Si_3N_4$ diaphragm. A novel way to characterize the pressure sensor has been demonstrated employing an atomic force microscope in contact mode with a specially modified probe-tip to apply pressure on the suspended $Si_3N_4$ diaphragm. Relatively small pressure values ranging from 1 KPa to 12 KPa were achieved by this method. The resistance change for active resistors was found to be −0.1%-0.5% for the above applied pressure range. The present invention provides The present invention provides a method for fabricating piezoresistive polysilicon on a substrate by low-temperature metal induced crystallization by: (1) providing the substrate having a passivation layer; (2) performing, at or near room temperature in a chamber without breaking a vacuum or near-vacuum within the chamber, the steps of: (a) creating a metal layer on the passivation layer, and (b) creating an amorphous silicon layer on the metal layer, wherein the metal layer and the amorphous silicon layer have approximately the same thickness; (3) annealing the substrate, the passivation layer, the metal layer and the amorphous silicon layer at a temperature equal to or less than 600° C. and a period of time equal to or less than three hours to form a doped polysilicon layer below a residual metal layer; and (4) removing the residual metal layer to expose the doped polysilicon layer. The metal layer and the amorphous silicon layer can be created using RF Sputtering, Thermal Evaporation, E-beam Evaporation, Hot-Wire Chemical Vapor Deposition (HWCVD) and Low Pressure Chemical Vapor Deposition (LPCVD). A forming gas may also be used during the annealing process. This process can be used to fabricate one or more semiconductor devices.

In addition, the present invention provides a semiconductor device disposed on a substrate wherein the semiconductor device includes one or more elements containing a piezoresistive polysilicon fabricated by the process described above.

Moreover, the present invention provides a method for fabricating piezoresistive polysilicon on a flexible substrate by low-temperature metal induced crystallization by: (1) providing the flexible substrate having a passivation layer; (2) performing, at or near room temperature in a chamber without breaking a vacuum or near-vacuum within the chamber, the steps of: (a) creating an aluminum layer on the passivation layer, and (b) immediately creating an amorphous silicon layer on the metal layer, wherein the aluminum layer and the amorphous silicon layer have approximately the same thickness; (3) annealing the flexible substrate, the passivation layer, the aluminum layer and the amorphous silicon layer in the presence of a forming gas at a temperature between approximately 300° C. and 550° C. and a period of time equal to or less ninety minutes to form a doped polysilicon layer below a residual aluminum layer; and (4) removing the residual aluminum layer to expose the doped polysilicon layer. The metal layer and the amorphous silicon layer can be created using RF Sputtering, Thermal Evaporation, E-beam Evaporation, Hot-Wire Chemical Vapor Deposition (HWCVD) and Low Pressure Chemical Vapor Deposition (LPCVD).

The present invention also provides a method for fabricating a force or pressure sensor on a substrate by: (1) providing the substrate having a passivation layer; (2) creating a sacrificial polyimide layer on the passivation layer; (3) curing the sacrificial polyimide layer; (4) creating a silicon nitride layer on the sacrificial polyimide layer as a diaphragm layer; (5) patterning the diaphragm layer for one or more diaphragms; (6) etching the patterned diaphragm layer to expose the sacrificial polyimide; (7) patterning one or more piezoresistors by creating a second sacrificial layer on the diaphragm layer and creating an inverse pattern for the one or more piezoresistors; (8) performing, at or near room temperature in a chamber without breaking a vacuum or near-vacuum within the chamber, the steps of: (a) creating a metal layer on the passivation layer, and (b) creating an amorphous silicon layer on the metal layer, wherein the metal layer and the amorphous silicon layer have approximately the same thickness; (9) removing the second sacrificial layer to expose the one or more piezoresistors; (10) annealing the substrate and the layers at a temperature equal to or less than 600° C. and a period of time equal to or less than three hours to form a doped polysilicon layer below a residual metal layer; (11) removing the residual metal layer to expose the doped polysilicon layer; (12) depositing and defining one or more electrical connections to the one or more piezoresistors; and (13) suspending the diaphragm(s) by removing the sacrificial polyimide layer under the diaphragm(s). The metal layer and the amorphous silicon layer can be created using RF Sputtering, Thermal Evaporation, E-beam Evaporation, Hot-Wire Chemical Vapor Deposition (HWCVD) and Low Pressure Chemical Vapor Deposition (LPCVD). A forming gas may also be used during the annealing process.

Furthermore, the present invention provides a force or pressure sensor disposed on a substrate wherein the force or pressure sensor is fabricated by the process described above.

The present invention is described in detail below with reference to the accompanying drawings.

BRIEF DESCRIPTION OF THE DRAWINGS

The above and further advantages of the invention may be better understood by referring to the following description in conjunction with the accompanying drawings, in which:

FIG. 5 shows a SEM image of the final polysilicon film obtained by AIC at 500° C. for 90 minutes and subsequently etched in an Al-etch solution in accordance with one embodiment of the present invention;

FIGS. 6A-6D show XRD plots for the as-deposited amorphous silicon film (FIG. 6A) and the films annealed at 550° C. (FIG. 6B), 500° C. (FIG. 6C) and 475° C. (FIG. 6D) for 90 minutes in forming gas and subsequently etched in aluminum etch in accordance with one embodiment of the present invention;

(FIG. 7A), 475° C. (FIG. 7B), 450° C. (FIG. 7C) and 400° C. (FIG. 7D) for 60 minutes in forming gas and subsequently etched in aluminum etch in accordance with one embodiment of the present invention;

FIGS. 10A and 10B show the optical microscope pictures of the resistor pixels after lift-off in accordance with one embodiment of the present invention;

(FIG. 14A), and with constant anneal time of 60 minutes and for anneal temperatures of 400° C., 450° C., 475° C. and 500° C. (FIG. 14B) in accordance with one embodiment of the present invention;

FIG. 19A is an image of a pressure sensor comprised of a half-Wheatstone Bridge with two active polysilicon piezoresistors on a micromachined $Si_3N_4$ diaphragm and two passive resistors, and FIG. 19B is an inset showing the individual resistor dimensions in accordance with one embodiment of the present invention;

FIG. 24 is a SEM image of Device#1 with 80×80 μm² $Si_3N_4$ diaphragm showing active resistors and passive resistors connected in half-Wheatstone bridge configuration, inset: individual piezoresistor dimensions in accordance with one embodiment of the present invention;

FIGS. 26A&B are plots of %($\Delta R/R_0$) versus applied pressure, P (KPa) for (a) Device#1 and (b) Device#2 for tapping engagement case respectively in accordance with one embodiment of the present invention.

DETAILED DESCRIPTION OF THE INVENTION

Figure 1:
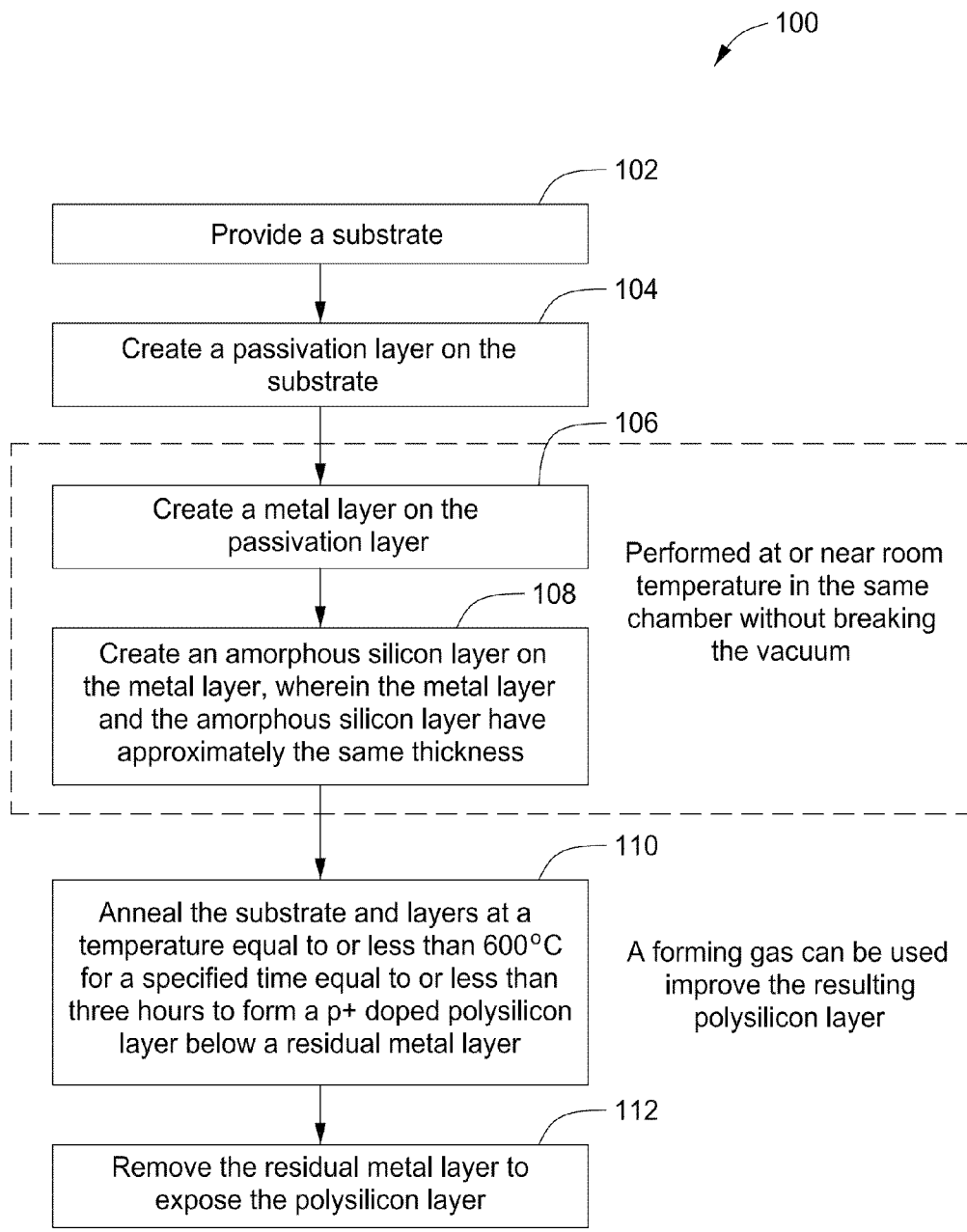
FIG. 1 is a flow chart illustrating a method for fabricating piezoresistive polysilicon by low-temperature metal induced crystallization in accordance with one embodiment of the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention. The discussion herein relates primarily to low-temperature aluminum induced crystallization and polysilicon piezoresistive pressure sensors, but it will be understood that the concepts of the present invention are applicable to any low-temperature metal induced crystallization and any semiconductor device that can benefit from the use of a piezoresistive polysilicon film.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The present invention describes a low temperature method of fabricating silicon piezoresistors using aluminum induced crystallization (AIC). The semiconductor processing technique of the present invention causes the amorphous silicon thin film to form crystalline grains without resorting to high-temperature annealing. As a result, polycrystalline silicon thin films can be realized on top of materials and structures that cannot be heated to high temperatures. One direct application of the present invention is a conformal pressure/force sensors on flexible substrates, for example a polysilicon piezoresistor pressure sensors on a plastic substrate. Polycrystalline thin films typically require high temperature deposition or low temperature deposition followed by high-temperature annealing with temperatures exceeding 600° C. This is not post-CMOS compatible for the fabrication of integrated circuits with MEMS sensors for measuring pressure, flow, and acceleration. By using AIC to deposit piezoresistive polysilicon, the annealing temperature can be decreased to 500° C. Present technology requires high temperature processing to crystallize the amorphous silicon film. The method of the present invention is performed at low temperature in contrast to the current technology that uses the high temperature processing to also "dope" (introduce n- or p-type diffusant atoms into the silicon) the film to adjust its conductivity. The method of the present invention dopes the polysilicon film with the diffusing aluminum at low temperatures.

The present invention describes the development and characteristics of AIC polysilicon films are described. The method of the present invention differs from previous work [43,68, 74,75] in the specific method of structure geometry, substrate selection, layer hierarchy, layer thicknesses, interface layer, deposition techniques, and annealing profile. The aluminum induced crystallization technique of the present invention provides a viable alternative for the deposition of uniform, low-temperature polysilicon thin films on polyimide substrates and on structures with low thermal budget requirements. Nanocrystalline to microcrystalline grain sizes up to the size of 10-15 μm have been obtained by this process [29,73]. The present invention further describes the fabrication of surface-micromachined pressure sensors on flexible polyimide substrates has thus been attempted using AIC, based on the design as described in [56]. The use of polysilicon thin film as piezoresistive material for fabrication of pressure/force sensors is dictated by the fact that the process flow could be made CMOS compatible, which would allow integration of the read-out and various signal-conditioning circuitry easily on the same chip. Doped polysilicon films display comparable electrical properties as thin metal films, with higher gauge factor (GF).

Figure 2A:
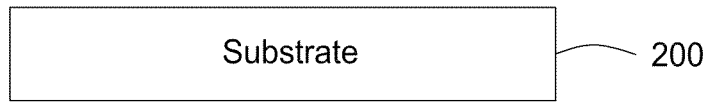
FIGS. 2A-2F are schematic diagrams showing sample structures during the fabrication process of FIG. 1.
Figure 2B:
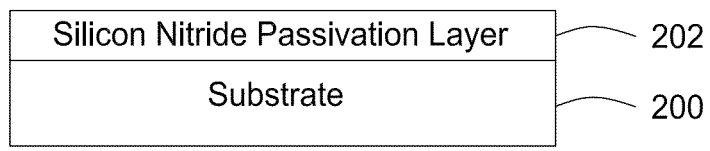

Now referring to FIGS. 1 and 2A-2F, a flow chart illustrating a method 100 for fabricating piezoresistive polysilicon by low-temperature metal induced crystallization (FIG. 1) and schematic diagrams showing sample structures (FIGS. 2A-2F) during the fabrication process 100 in accordance with one embodiment of the present invention are shown. A substrate 200 is provided in block 102 (FIG. 2A). The substrate 200 can be silicon, silicon wafer, polyimide flexible substrate (e.g., PI-2611), glass, indium antimonide, GaAs, GaN, CdSe, SiC, CdTe, CdHgTe, ZnS, other suitable foundation, or a combination thereof. A passivation layer 202 is created or deposited on the substrate 200 in block 104 (FIG. 2B). The passivating material will depend on the substrate 200 material, but can include silicon nitride, zinc sulfide, silicon oxide, or combinations thereof.

Figure 2C:
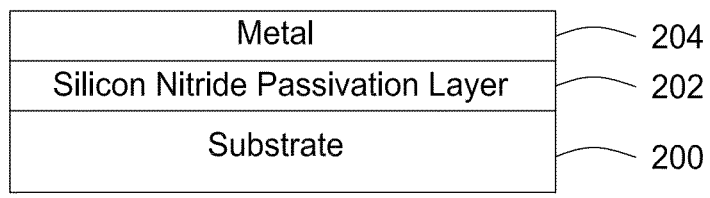
Figure 2D:
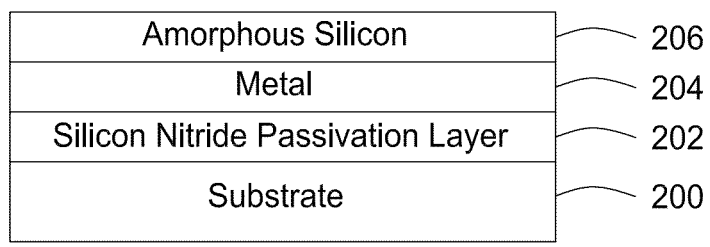
Figure 2E:
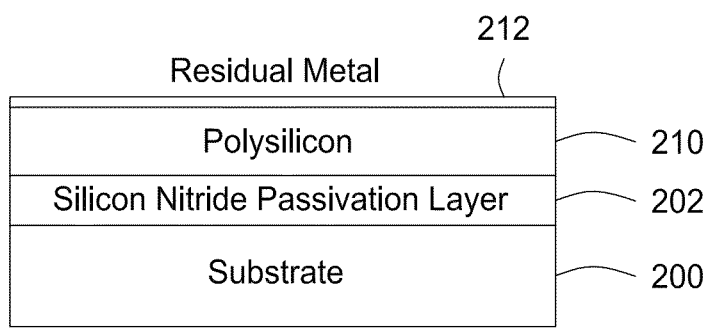
Figure 2F:
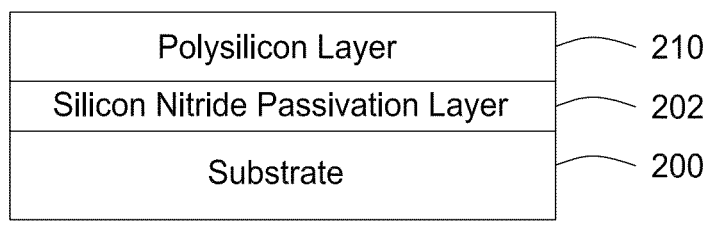

The next steps are performed at or near room temperature in the same chamber without breaking the vacuum or near vacuum. A metal layer 206 is created or deposited on the passivation layer 204 in block 106 (FIG. 2C). The metal can be Al, Ni, Au, Ag, Cu, Cr, Co, Fe, Pt, Ti, Zn, Pd, and alloys thereof. An amorphous silicon layer 208 is immediately created or deposited on the metal layer 206 in the same chamber without breaking the vacuum or near vacuum in block 108 (FIG. 2D). The metal layer 206 and the amorphous silicon layer 208 can be deposited using RF sputtering or other suitable deposition technique. Note that the thickness of the metal layer and the amorphous silicon layer should be approximately the same. The substrate 202 and layers 204-208 are annealed at a temperature equal to or less than 600° C. for a specified time equal to or less than three hours in block 110. The annealing process 110 causes the metal in the metal layer 206 to diffuse through the amorphous silicon in the amorphous silicon layer 208 and create a p+ doped polysilicon layer 210 between the passivation layer 204 and a residual metal layer 212 (FIG. 2E). A forming gas, such as Ar, Kr, $N_2$, $H_2$, $H_2O$, CO, $CO_2$ and combinations thereof, can be used during the annealing process 110 to improve the characteristics, such as annealing time (diffusion rate), grain size, surface smoothness and uniformity with minimal residual stress, of the resulting polysilicon layer 210. Note that additional doping steps are not required. The residual metal layer 212 is then removed in block 112 (FIG. 2F). This process can be used to fabricate one or more semiconductor devices.

The process described above will now be described in more detail with respect to a specific embodiment of the present invention in which the metal used to induce crystallization of the amorphous silicon is aluminum. Aluminum is used for the crystallization of amorphous silicon because it is inexpensive, easily removed after crystallization and annealing temperatures as low as 150° C. had been reported [43]. This process obtains continuous polysilicon films well below the eutectic temperature of 577° C. for aluminum and silicon binary system. There are several factors that affect this process: (i) annealing temperature: lower annealing temperatures results in longer crystallization times, lower nucleation density and larger grain sizes [50], (ii) annealing time, (iii) layer thickness ratio: in order to form continuous polysilicon films under steady temperature conditions, the thicknesses of amorphous silicon layer and aluminum layer must be the same [49], (iv) aluminum grain structure—differences in the gram geometry by different deposition techniques viz. thermal evaporation (results in large grain polysilicon film but suffers from non-smooth surface and relatively poor reproducibility and longer crystallization times), e-beam evaporation (results in smallest grain polysilicon film, but there is good reproducibility and shorter crystallization times are obtained), dc magnetron sputtering (gives a good compromise between the crystallization time, grain size and reproducibility [63]), (v) aluminum amorphous silicon layer interface: presence of aluminum oxide on the interface layer effects polysilicon grain size (larger grain sizes are obtained with thicker aluminum oxide interface layer; however it slows the crystallization process due to increase in the activation energy of the nucleation process [64]), and (vi) annealing ambient—annealing is carried out in vacuum, nitrogen, forming gas, and hydrogen atmosphere. Annealing performed in presence of hydrogen results in smooth surface and uniform polysilicon film. Grain size is increased, and has shorter crystallization times with aluminum oxide as interface layer [45]. Using a forming gas provides a good compromise between grain size, and crystallization time.

Figure 3:
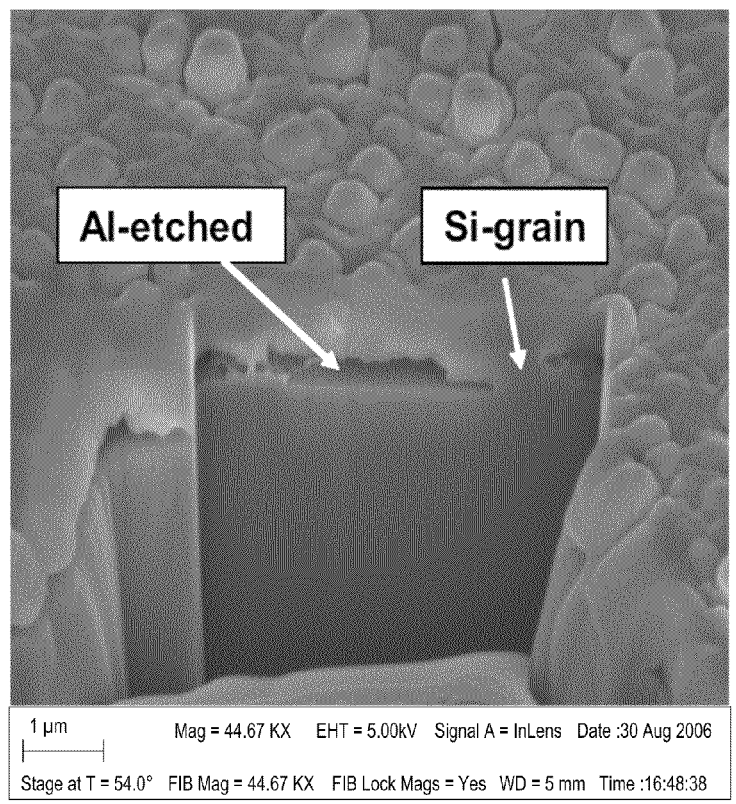
FIG. 3 shows a Scanning Electron Microscope (SEM) image of as-deposited amorphous silicon film sectioned with focused ion beam (FIB) in accordance with one embodiment of the present invention.

In order to investigate the structural properties of polysilicon films obtained by Aluminum Induced Crystallization (AIC), several trials have been conducted on $Si_3N_4$ passivated P-type <100> Si wafers using different deposition and annealing procedures. A typical procedure started with the deposition of a 0.5 μm thick aluminum on $Si_3N_4$, immediately followed by a 0.5 μm thick amorphous Si-layer, both using RF sputtering without breaking vacuum. FIG. 3 shows a Scanning Electron Microscope (SEM) image of as-deposited amorphous silicon film sectioned with focused ion beam (FIB) in accordance with one embodiment of the present invention.

In order to be able to low stress polyimide PI-2611 [44] both as the flexible substrate and as a sacrificial layer, annealing temperatures closer to the glass transition temperature of PI-2611 (Tg ~360° C.) were selected. In the first case, the wafer was annealed by rapid thermal annealing (RTA) at 400°

Figure 4:
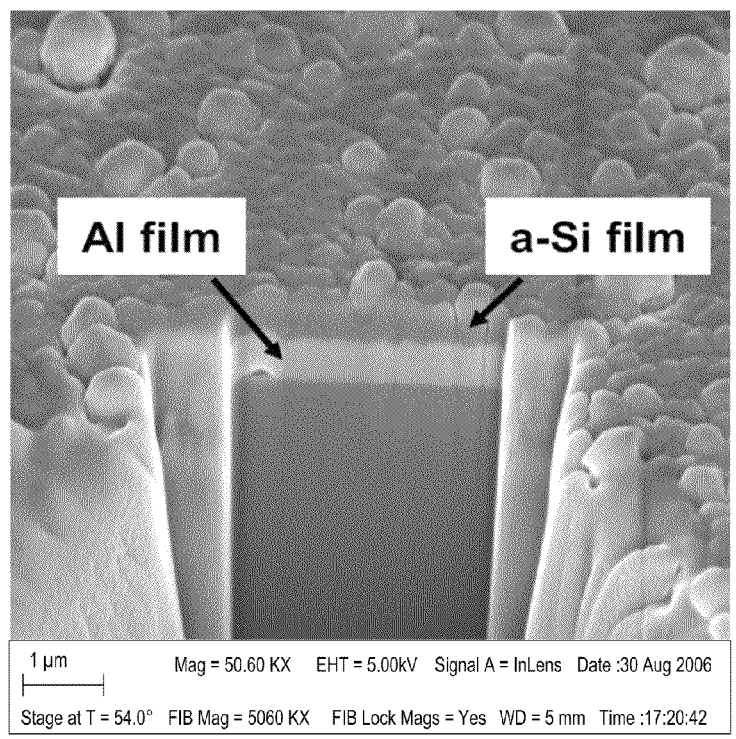
FIG. 4 shows a SEM image of the polysilicon film annealed at 400° C. and subsequently etched in an Al-etch solution in accordance with one embodiment of the present invention.

C. for a duration of 90 minutes in forming gas (98% $N_2$+2% $H_2$) ambient, which gave rise to the diffusion of aluminum through the amorphous silicon to form the top layer. RTA was chosen as the annealing equipment in order to obtain precise control of the anneal profile, i.e. temperature ramp-up, dwell and ramp-down times. The ramp-up time from room temperature (RT=25° C.) to target anneal temperature ($T_{anneal}$) and corresponding ramp-down (cooling) time was kept constant at 10 minutes. The residual aluminum on the top surface was etched way after annealing, resulting in a uniform, large-grained silicon film as shown in FIG. 4.

Table I compares the Energy Dispersive Spectroscopy (EDS) results for as-deposited film, film annealed at 400° C. for 90 minutes and the final crystallized polysilicon film obtained.

TABLE I

EDAX Analysis Results

| Sample | Element | Wt % | At % |
|---|---|---|---|
| As deposited | O | 5.73 | 9.63 |
| | Al | 5.46 | 5.44 |
| | Si | 88.8 | 84.93 |
| After annealing at 400° C. for 90 minutes | O | 12.39 | 19.28 |
| | Al | 84.12 | 77.62 |
| | Si | 3.49 | 3.09 |
| After annealing and etching in AL Etch | O | 18.79 | 28.85 |
| | Al | 1.9 | 1.7 |
| | Si | 79.31 | 69.42 |

From Energy Dispersive X-ray Micro-Analysis (EDAX), it could be seen that a small amount of aluminum was embedded in the final crystallized film which supplemented as a p-type dopant in the polysilicon film. This eliminated the need for an additional doping step. However, it was observed that a small amount of oxygen is also incorporated in the film during the annealing step and due to thin native oxide formation on the surface.

To ensure that the final film obtained by AIC of amorphous silicon is polycrystalline in nature, XRD measurements were carried out for samples annealed at different temperatures below the eutectic temperature of 577° C. for aluminum and silicon binary system (ranging from 400° C. to 550° C. with annealing times of 30 to 90 minutes). The samples were annealed in a forming gas ambient, which gave a good compromise between grain size and crystallization time. The presence of $H_2$ results in a smooth surface and a uniform polysilicon film with minimal residual stress. In addition, the annealing time to achieve crystallization was found to be much shorter than the case with pure $N_2$ since $H_2$ aids the diffusion of Si and Al [45]. As shown in FIG. 5, the final film obtained at the annealing temperature of 500° C. for 90 minutes [46] displayed uniform grain sizes up to 150-200 nm. The silicon grains showed a preferential (100) crystal orientation [65,66]. The resultant polysilicon film was p+ doped due to presence of aluminum as the dopant impurity, which eliminated the necessity of further doping steps to increase the film's electrical conductivity.

XRD (x-ray diffraction) analysis was carried out to study the crystal structure of the polysilicon films using Siemens D-500 Powder Diffractometer. The voltage was set to 40 kV and current was set to 30 mA. X-ray was generated from $Cu_{K-\alpha}$ source of wavelength 1.54 Å. The peak for <100> plane for silicon was obtained for 2θ value of 69.13°. Then scan measurements were performed by selecting a 2θ range from 20° to 60°. FIG. 6A shows the XRD plot of as deposited film before annealing. The presence of no peaks in the XRD characteristic shows that the top layer sputtered silicon film is amorphous. FIGS. 6B-6D show the XRD plots for polysilicon films obtained at a constant annealing time of 90 minutes for annealing temperatures of 550° C. (FIG. 6B), 500° C. (FIG. 6C) and 475° C. (FIG. 6D). From the <111> peak for the film annealed at 550° C., the grain size was approximated as 36 nm. Similarly, for films annealed at 500° C. and 475° C., the approximate grain sizes of 51 nm and 59 nm respectively.

Figures 7A, 7B, 7C, 7D:
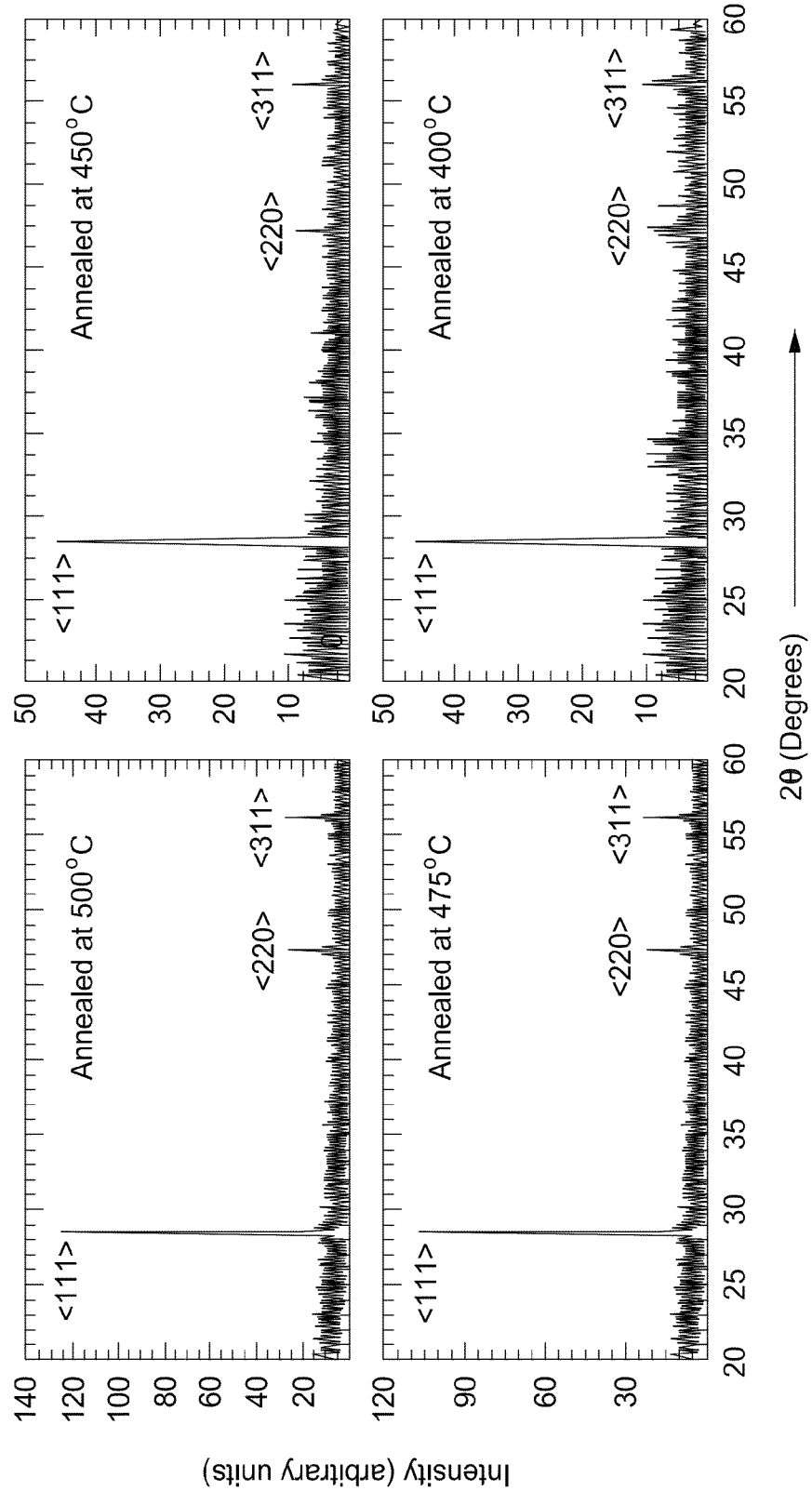
FIGS. 7A-7D show XRD plots for polysilicon film obtained by annealing at 500° C.
Figures 8A, 8B:
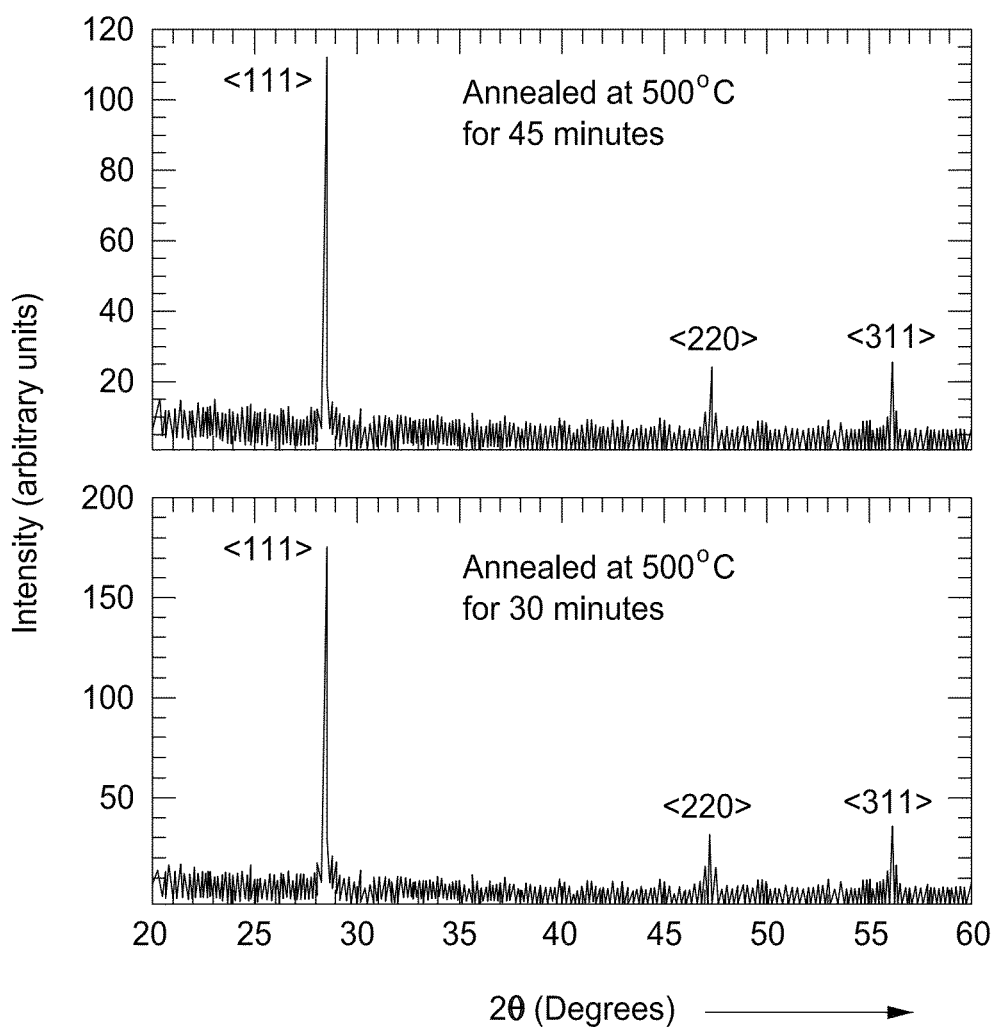
FIGS. 8A and 8B show XRD plots for polysilicon film obtained by annealing at 500 0 C for 45 minutes (FIG. 8A) and 30 minutes (FIG. 8B) in forming gas and subsequently etched in aluminum etch in accordance with one embodiment of the present invention.

FIGS. 7A-7D show the XRD plots for polysilicon films obtained at a constant annealing time of 60 minutes for annealing temperatures of 500° C. (FIG. 7A), 475° C. (FIG. 7B), 450° C. (FIG. 7C) and 400° C. (FIG. 7D). FIGS. 8A and 8B compare the XRD plots of the films annealed at 500° C. and anneal time of 45 minutes (FIG. 8A) and 30 minutes (FIG. 8B) respectively. These experiments were aimed to help study (i) the morphology of final obtained polysilicon film, and (ii) variations in grain sizes with different anneal temperatures and anneal times. Table II gives the location of corresponding <111>, <220> and <311> peaks for different annealing temperatures and times described above.

TABLE II

XRD Analysis of the Films Obtained at Different Annealing Temperatures and Annealing Times

| Figure | Anneal Temperature (° C.) | Anneal Time (minutes) | <111> | <220> | <311> |
|---|---|---|---|---|---|
| 6D | 475 | 90 | 28.48° | 47.34° | 56.20° |
| 6C | 500 | 90 | 28.54° | 47.48° | 56.28° |
| 6B | 550 | 90 | 28.70° | 47.58° | 56.42° |
| 7A | 500 | 60 | 28.50° | 47.32° | 56.15° |
| 7B | 475 | 60 | 28.52° | 47.41° | 56.23° |
| 7C | 450 | 60 | 28.48° | 47.37° | 56.17° |
| 7D | 400 | 60 | 28.48° | 47.36° | 56.18° |
| 8A | 500 | 45 | 28.47° | 47.33° | 56.15° |
| 8B | 500 | 30 | 28.50° | 47.39° | 56.20° |

These measurements validate the polycrystalline nature of the resultant film obtained by AIC of amorphous silicon.

Debye-Scherer's formula [47] was used to estimate the grain sizes, $L_C$ of films:

$$L_C = \frac{K \times \lambda_{Cu-\alpha}}{B \times \cos(\theta_B)} \text{ nm} \quad (3)$$

where:
K is the grain shape factor with a typical value of 0.9 to 1.0;
$\lambda_{Cu-\alpha}$ is the wavelength of Cu-α source with a value of 1.54 Å;
B is the full width at half maximum; and
$\theta_B$ is the Bragg's angle where the maximum peak value occurs.

Figure 9A:
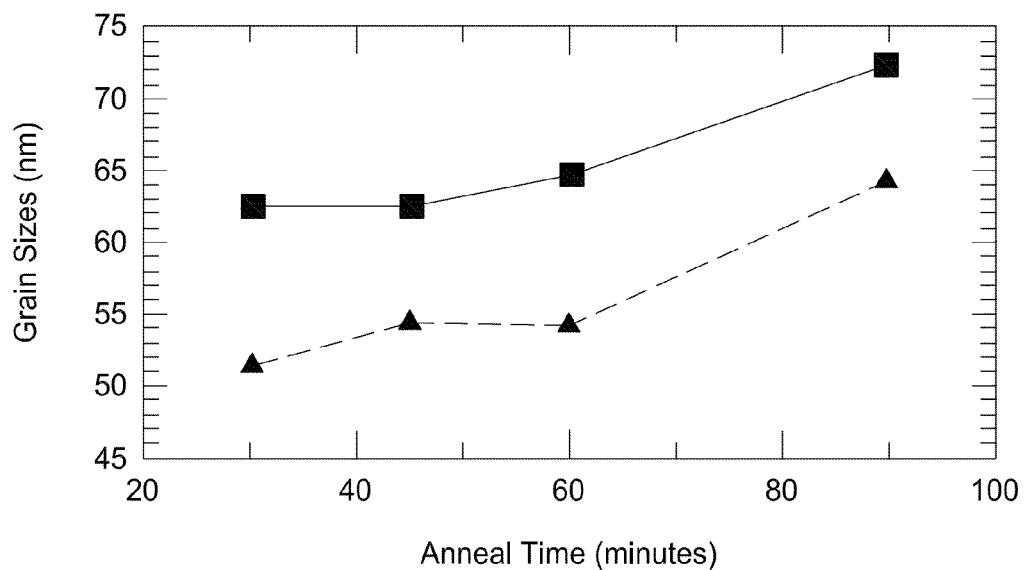
FIGS. 9A and 9B show measured variations in grain size with constant anneal temperature of 500° C. and varying anneal time (FIG. 9A), and with constant anneal time of 60 minutes and varying temperature (FIG. 9B) in accordance with one embodiment of the present invention.
Figure 9B:
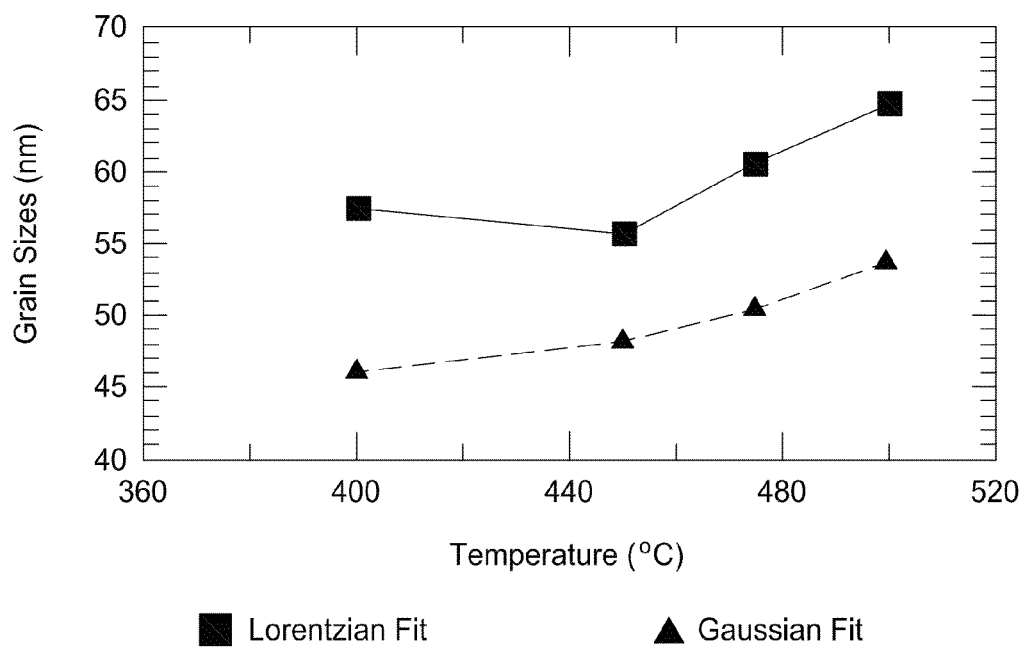

Only <111> peak was considered for simplicity. FIGS. 9A and 9B compare the average polysilicon grain sizes for films annealed at different temperatures (FIG. 9B) and for varying duration (FIG. 9A), calculated using Eq. (3) by Gaussian and Lorentzian fittings to determine the Full Width at Half Maximum (FWHM), B for the <111> peak.

The difference in grain sizes estimated from SEM micrograph and from XRD measurements is accounted due to certain percentage of machine calibration error introduced during the measurement of B from XRD peaks, and due to residual stress acting on the final polysilicon film which leads to peak widening thus increasing B. This results in underestimation of the grain size. On the other hand, the inability of an SEM image to reveal all grains comprising of various small-angled grain boundaries results in overestimating the grain sizes. The estimated the average grain size of the resultant polysilicon film obtained at annealing temperatures of 500° C. for 90 minutes [48] was between 100-150 nm.

The polysilicon film obtained by AIC is strongly dependent on (i) annealing temperature, (ii) crystallization time, (iii) aluminum and amorphous silicon layer ratio and sequence, (iv) interface layer between Al/Si layers and (v) Al grain structure [49,50]. From FIG. 9A it can be seen that for a constant annealing temperature of 500° C., the grain size increases with the annealing time. FIG. 9B shows that for a constant annealing time of 60 minutes, lower temperatures result in smaller grain sizes, also obtained by Y. Matsumoto et. al. [51]. The amorphous Si:H film obtained by PECVD was treated with a 10% HF solution to remove any native silicon oxide prior to Al evaporation. However, to obtain large polysilicon grains from AIC, lower temperatures are preferred [42,49]. One of the possible reasons for this observed anomaly could be the absence of any interface oxide layer on the Al/Si layer interface, as in this case. The Si film was deposited immediately after Al film sputtering without breaking the chamber vacuum, which was maintained at $10^{-8}$ to $10^{-7}$ Torr range. Earlier works on AIC stated that when Al layer was intentionally oxidized by exposing to air for a few minutes to a couple of weeks to grow $Al_2O_3$ on the interface, larger grains resulted, however, at the expense of increased required crystallization time [52,53,54,55].

The driving force for the layer exchange is larger for the Si/Al bilayers than for Al/Si bilayers [67]. For example, layer exchange for Si/Al bilayer would require 1 hour at 250° C. when compared to Al/Si bilayer required anneal time of 25 hours [68]. Chelawat et. al. [70] uses a Si/Al bilayer, so in-situ AIC works in their case. According to [69], 20 nm of Al deposited at temperature of 300° C. would crystallize only 63% of the a-Si:H film. The crystallization peaks are more dominant and sharper using a post-deposition anneal than using in-situ annealing [69]. Chelawat et. Al. [70] stated that no crystallization was observed for Al deposition temperature of 150° C. Thus the in-situ process is limited by the deposition temperature of Al.

However, post-deposition annealing process provided by the present invention is feasible with a-Si and Al films deposited by any method, viz. Plasma-Enhanced Chemical Vapor Deposition (PECVD), RF Sputtering, Thermal and E-beam Evaporation, Hot-Wire Chemical Vapor Deposition (HWCVD) and Low Pressure Chemical Vapor Deposition (LPCVD). The Al/Si bilayer is selected because after annealing step, the excess Al after crystallization reaches the surface and can be etched away to reveal the polycrystalline silicon. This structure would be feasible with other fabrication steps for various applications.

Unlike previous methods, the process in accordance with the present invention employs RF sputtered a-Si at room temperature which allows the use of low temperature substrates. In addition, this method can employ a thicker Al film, so a thicker polysilicon film can be obtained. For example: (1) Chelawat et. al. used Hot-Wire Chemical Vapor Deposition (HWCVD) for deposition of hydrogenated amorphous silicon (a-Si:H) at substrate temperature of 300° C. on 7059 Corning Glass as substrate [70]; (2) Zou et. al. used Plasma-Enhanced Chemical Vapor Deposition PECVD (a-Si:H) for deposition of hydrogenated amorphous silicon (a-Si:H) on Si wafer [71]; (3) Naseem et. al. used Plasma-Enhanced Chemical Vapor Deposition PECVD (a-Si:H) for deposition of hydrogenated amorphous silicon (a-Si:H) at substrate temperature of 250° C. on Si wafer [72]; (4) Chelawat et. al. used Thermal Evaporation for deposition of Al layer at temperatures greater than 250° C. to 300° C. [70]; and (5) Zou et. al. used Thermal Evaporation where as Naseem et. al. RF sputtered Al at 40° C. [71].

In addition, the process in accordance with the present invention does not require the formation of an interface layer because the layers are not exposed to air and the films are deposited subsequently in the same chamber without breaking the vacuum. As a result, the present invention has the advantage of being shorter in total time needed to obtain a crystallized polysilicon film than previous processes. For example, Chelawat et. al. work involves thin layer of aluminum oxide ($Al_2O_3$) formed during sample transfer [70]. Zou et. al. exposes the sample to air from 10 minutes to 3 days [71]. Naseem et. al. also involves exposing the sample to air for times ranging from 10 minutes to 2-days [72].

In one embodiment of the present invention, a forming gas (98% $N_2$+2% $H_2$) is used to passivate the dangling bonds, and also help decrease defects. A Rapid Thermal Annealer (RTA) was used to anneal the samples as it provides better control over anneal profile. Since Chelawat et. al. [70], Zou et. al. [71] and Naseem et. al. [72] do not use a forming gas, they needed hydrogenated amorphous film deposited by PECVD or HWCVD. As previously discussed, the present invention is not limited to those two deposition techniques.

Chelawat et. al. used HWCVD to deposit a-Si:H followed by deposition of Al at 300° C. [70]. This kick starts the diffusion process which leads to in-situ crystallization. However, if the fabrication process involves photo-resist or polyimide covered substrate during the film deposition process, in-situ crystallization could present a challenge. The present invention provides the versatility of patterning the films before and after crystallization step. In-situ crystallization technique involves two heating steps, when compared to the process provided by the present invention which involves only one post deposition anneal step. The crystallization time is inversely proportional to the anneal temperature. The present invention provides a good quality piezoresistive polysilicon film at anneal temperatures of 400° C. for 60 minutes and at 500° C. for 30 minutes.

Figures 11A, 11B:
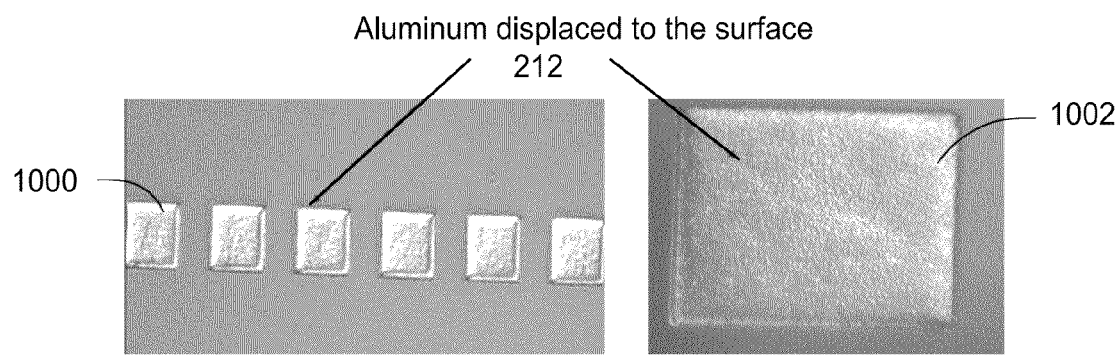
FIGS. 11A and 11B show the optical microscope pictures of the resistor pixels after annealing at 550° C. for 90 minutes in a forming gas using RTA in accordance with the present invention.
Figures 12A, 12B:
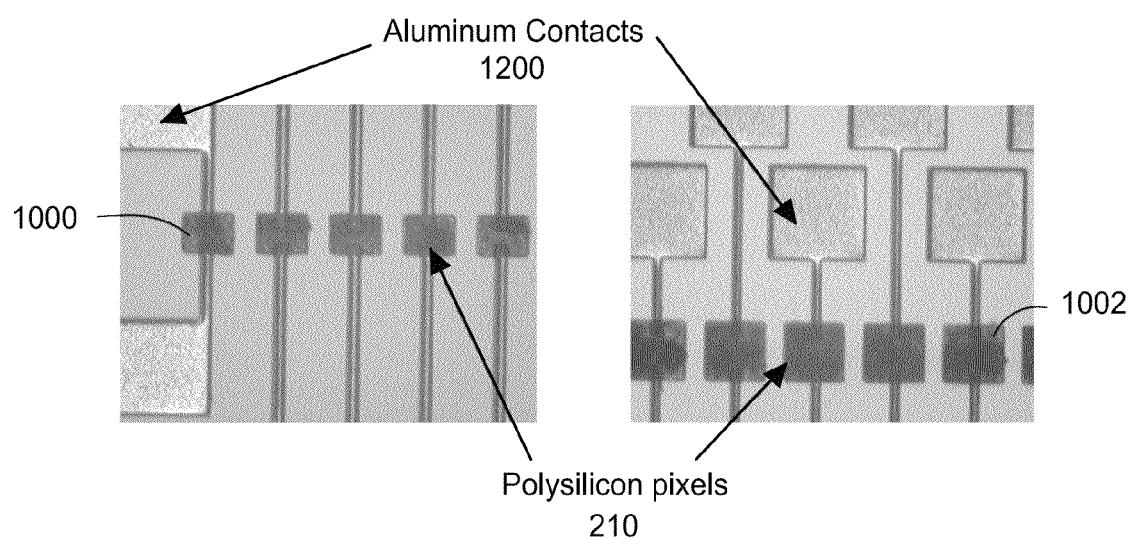
FIGS. 12A and 12B show the optical microscope pictures of the resistor pixels after etching to expose the polysilicon layer in accordance with the present invention.

The polysilicon films obtained by above process were tested for electrical conductivity by fabricating test structures. As shown in FIGS. 10-12, these test structures consisted of arrays of pixels of polysilicon film as described above, with sizes 40 µm×40 µm (resistor pixel 1000) and 60 µm×60 µm (resistor pixel 1002). The films were fabricated and patterned using lift-off before annealing, performed in acetone without ultrasonic agitation. FIGS. 10A and 10B show the optical microscope pictures of the resistor pixels 1000 and 1002 after lift-off in accordance with the present invention. The amorphous silicon 206 is on the surface of the resistor pixels 1000 and 1002 before annealing. After patterning, the samples were annealed in the RTA at 550° C., 500° C., and 475° C. for 90 minutes in presence of a forming gas. FIGS. 11A and 11B show the optical microscope pictures of the resistor pixels 1000 and 1002 after annealing at 550° C. for 90 minutes in a forming gas using RTA in accordance with the present invention. The aluminum underneath rises to the surface to form a residual metal layer 212 with the polysilicon layer crystallized and displaced downwards. The aluminum 212 on the surface was etched away in aluminum etch at 55° C. for 120 seconds to expose the polysilicon layer. FIGS. 12A and 12B show the optical microscope pictures of the resistor pixels 1000 and 1002 after etching to expose the polysilicon layer 210 in accordance with the present invention.

Figure 13A:
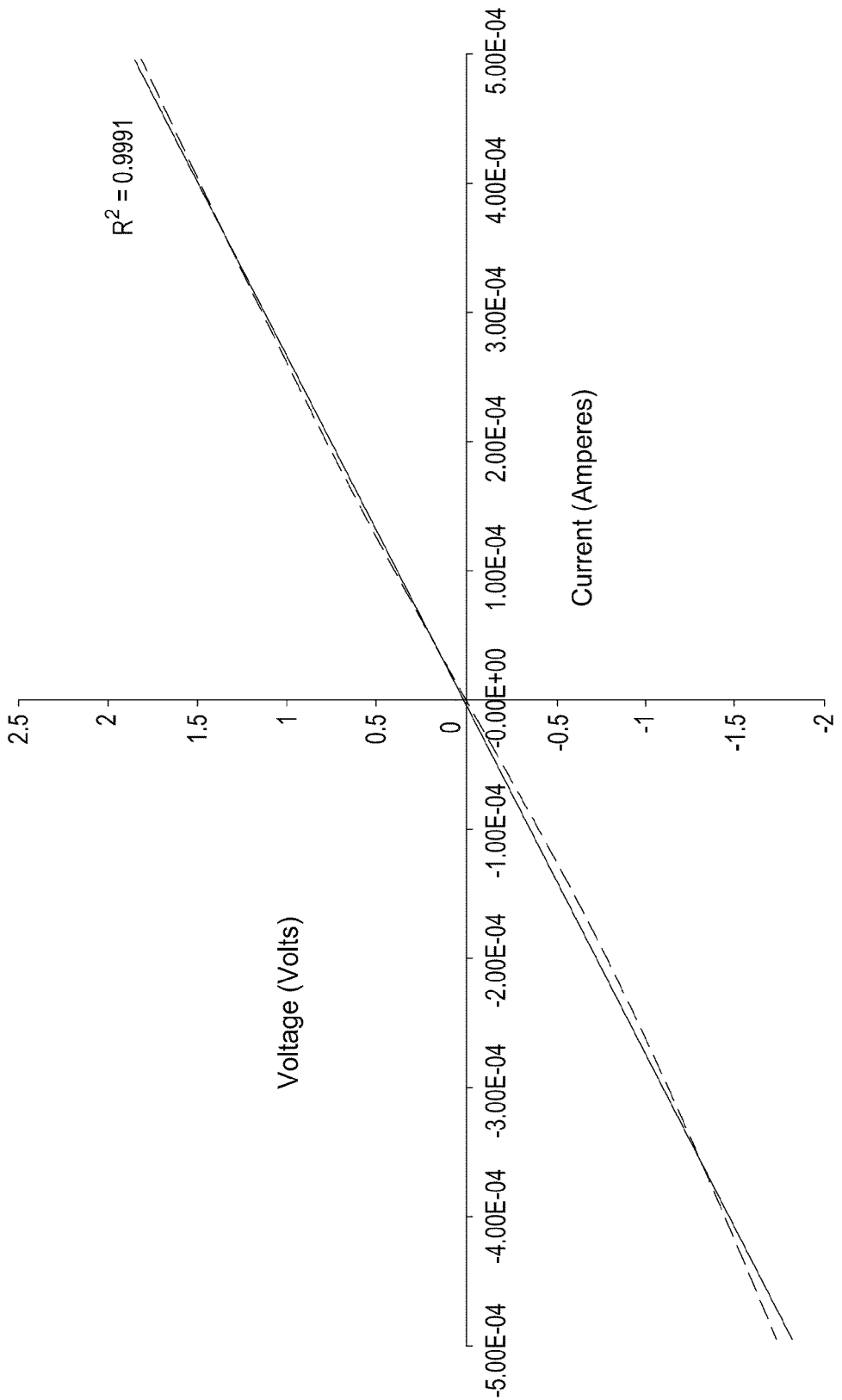
FIGS. 13A and 13B are plots of the I-V characteristics of the 550° C. and 500° C. polysilicon resistor pixels, respectively in accordance with one embodiment of the present invention.
Figure 13B:
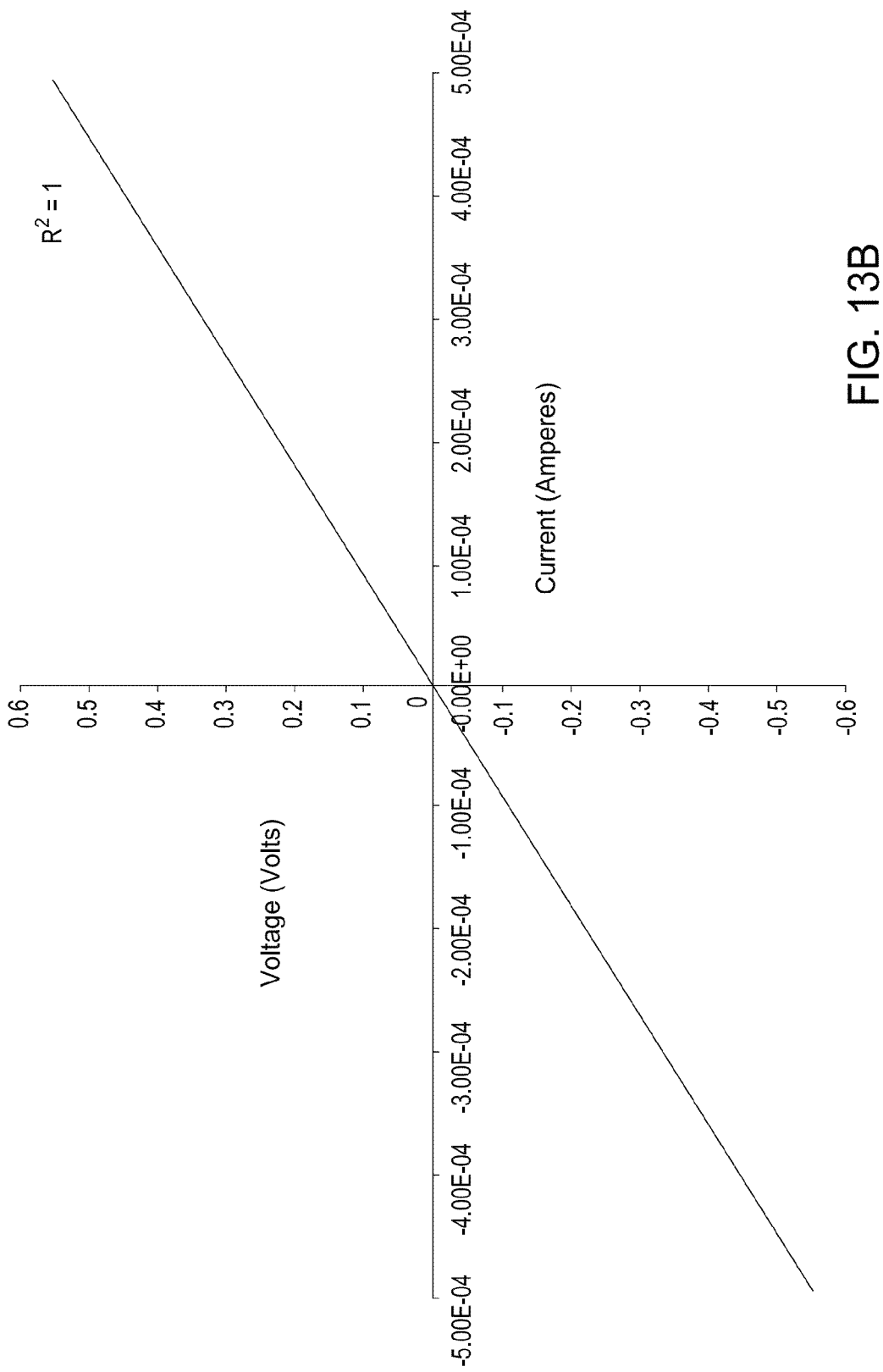

The samples were patterned with aluminum contact pads 1200 to measure the electrical resistance of the polysilicon film 210. The aluminum contacts were deposited by RF sputtering and patterned by lift-off. The sample was heated at 400° C. for 25 minutes in presence of forming gas to obtain ohmic contact between the aluminum contact arms 1200 and the polysilicon films 210. The procedure above was similarly followed for 500° C. and 475° C. annealed structures, to investigate the effect of annealing temperature on the electrical resistance of the polysilicon pixels 1000 and 1002. The structure obtained from above was probed and its I-V (current-voltage) characteristics were measured using a semiconductor parametric analyzer HP-4155C. FIG. 13A gives the plot of I-V characteristics of a polysilicon pixel for the 550° C. annealed samples. The current was varied from −0.5 mA to +0.5 mA, and corresponding voltages were measured. A resistance value of 3.8 KQ was measured for the 550° C. annealed sample. FIG. 13B gives the plot of I-V characteristics of a polysilicon pixel for 500° C. annealed samples. The current was varied form −0.5 mA to +0.5 mA and corresponding voltages were measured. A resistance value of 1.2 K$\Omega$ was measured the 500° C. annealed sample.

Figure 14A:
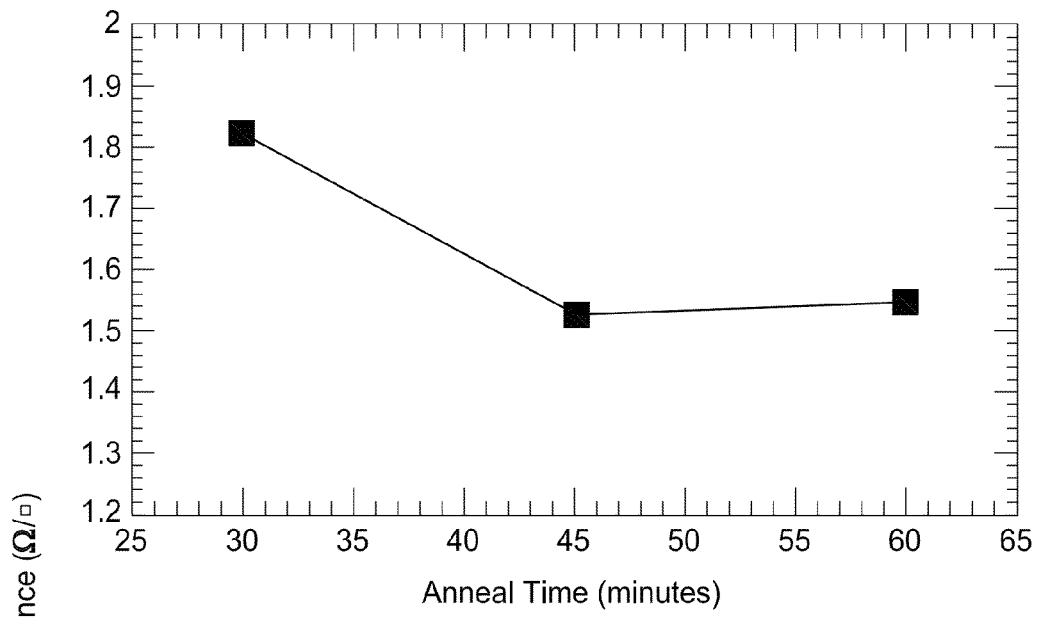
FIGS. 14A and 14B show measured sheet resistance for polysilicon films for anneal times of 30, 45 and 60 minutes at 500° C.
Figure 14B:
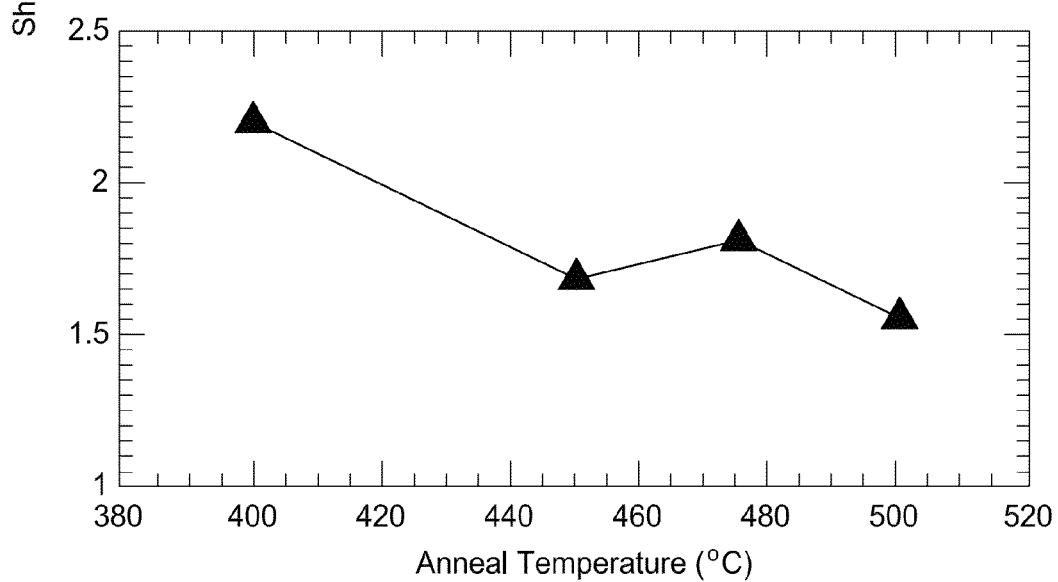

The sheet resistance of the polysilicon films obtained at different annealing conditions was measured using a four-point probe. FIGS. 14A and 14B show measured sheet resistance for polysilicon films of thickness ~0.5 μm obtained by annealing at 500° C. for anneal times of 30, 45 and 60 minutes (FIG. 14A), and with constant anneal time of 60 minutes and for anneal temperatures of 400° C., 450° C., 475° C. and 500° C. (FIG. 140B) in accordance with one embodiment of the present invention. The variation of sheet resistances for different annealing profiles shows that the obtained polysilicon films exhibit good electrical characteristics with Al as the dopant, which makes it a p-type polysilicon film.

Figure 15:
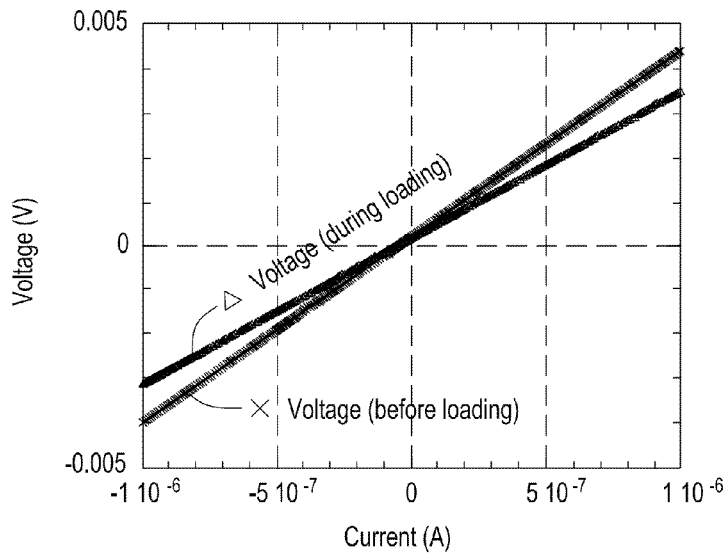
FIG. 15 is an I-V plot showing the change in pixel resistance before loading and during loading the structures with a pixel size 40 μm×40 μm in accordance with one embodiment of the present invention.

The piezoresistive characteristics of the films were assessed by using a third probe placed on the pixels to apply pressure and measure the change in the pixel resistance. As shown in FIG. 15, current was swept from −1.0 μA to +1.0 μA, and corresponding voltages were measured. Resistance values of 18.7 K$\Omega$ before loading and 7.3 K$\Omega$ during loading was measured for the 60 μm×60 μm pixels. For the 40 μm×40 μm pixels, the resistance values before and during loading were 4.4 K$\Omega$ and 3.5 K$\Omega$, respectively.

Figure 16A:
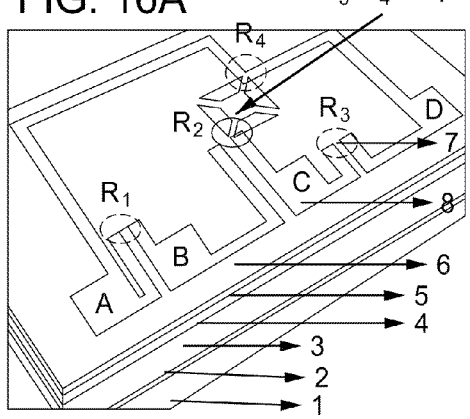
FIGS. 16A-16D show various schematics of a half-Wheatstone Bridge pressure sensors in accordance with one embodiment of the present invention.
Figure 16B:
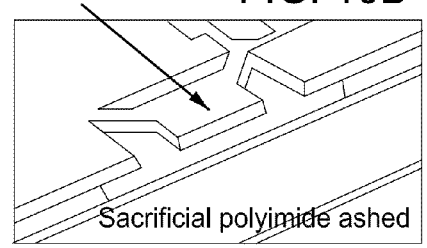
Figure 16C:
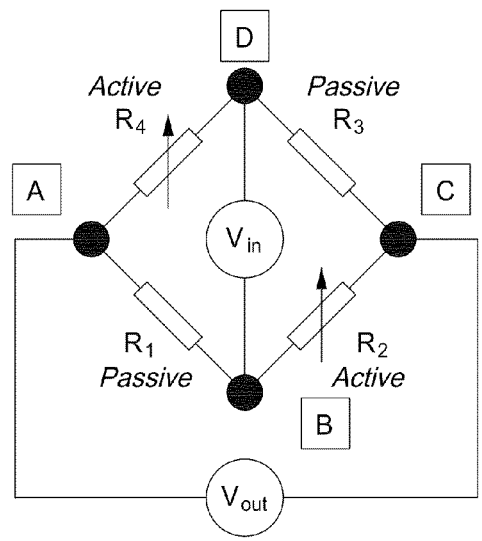
Figure 16D:
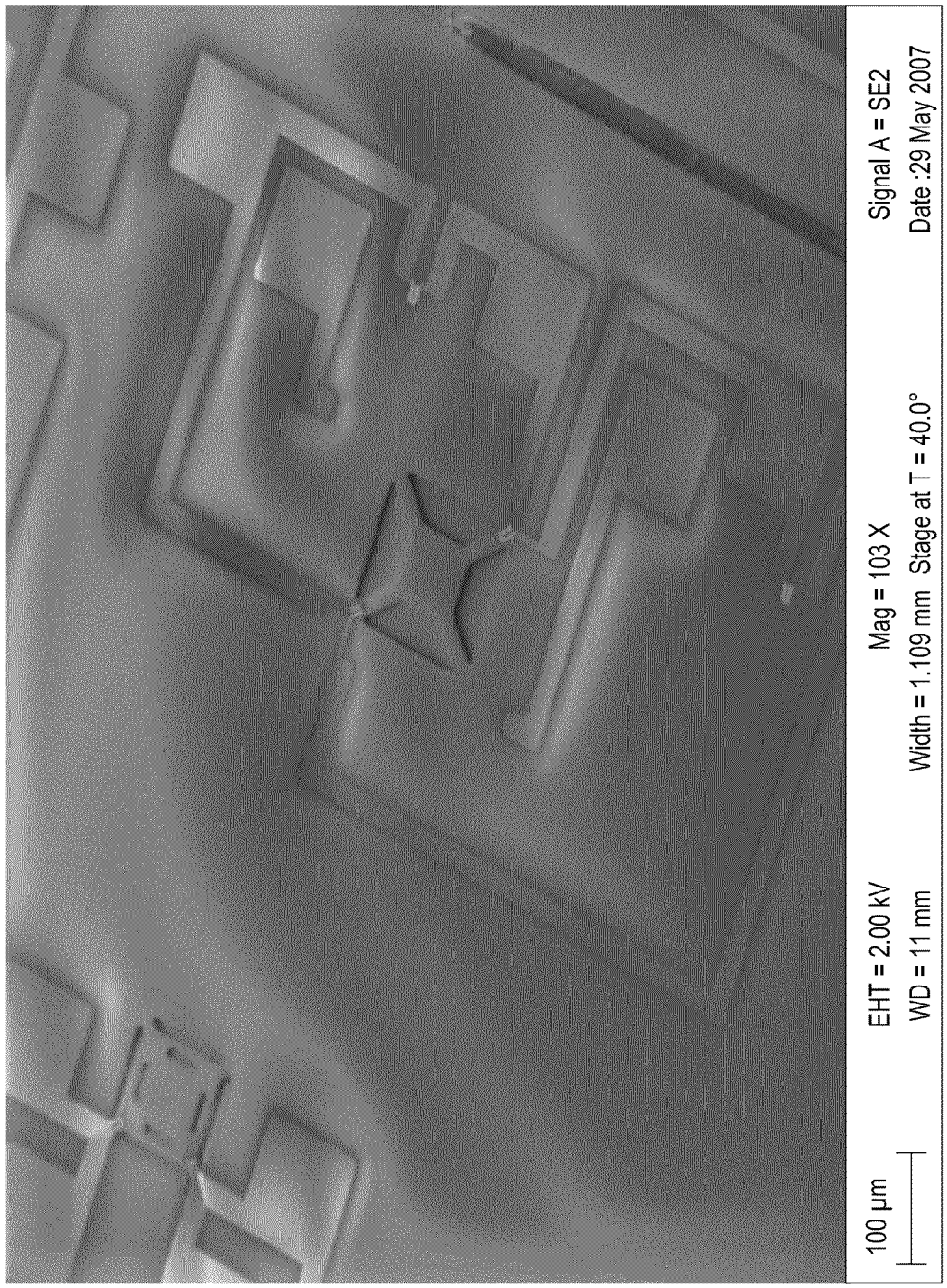

In order to assess the electrical and piezoresistive properties of the polysilicon film obtained by AIC, surface-micromachined diaphragm-based pressure sensor structures were designed and fabricated [56]. The pressure sensors were comprised of a micromachined $Si_3N_4$ shuttle plate, which connects to the silicon substrate through bridge arms where the polysilicon piezoresistors were placed. The shuttle plate and the connecting arms to the substrate make-up the diaphragm or the membrane layer, released by surface micromachining the sacrificial polyimide layer underneath. Piezoresistors were deposited using AIC technique described above and patterned on the bridge arm of the membrane layer and were later connected to each other using aluminum interconnects to form a half-Wheatstone Bridge. Several designs with different dimensions were fabricated on a die. A schematic of two such half-Wheatstone Bridge pressure sensors are depicted in FIGS. 16A-16D and FIGS. 17A-17C, together with the cross-section view. Here, two resistors on the micromachined membrane form the active piezoresistors, whereas the resistors fabricated on the substrate make the passive resistors of the Wheatstone bridge. More specifically, FIG. 16A shows a 3D Coventor™ model for a piezoresistive pressure sensor structure with individual layer descriptions. FIG. 16B shows a micromachined $Si_3N_4$ diaphragm suspended on the substrate after the sacrificial polyimide is removed. FIG. 16C shows a half-Wheatstone bridge representation of the sensor. FIG. 16D is a SEM image of the half-Wheatstone bridge sensor.

The prototype of a surface-micromachined pressure sensor in a half-Wheatstone bridge configuration shown in FIG. 16D was fabricated, employing two AIC polysilicon piezoresistors on the bridge arms of a $Si_3N_4$ membrane as the active sensor elements and two reference resistors. The fabrication of the pressure sensor started with deposition of RF sputtered silicon nitride passivation layer. Flexible polyimide PI-5878G and PI-2610 were used as substrate and sacrificial layers respectively. Different shapes and sizes of piezoresistors and membrane were considered and fabricated as described in [56]. This facilitated a comparative study on how the sensitivity of the pressure sensor changed with variations in the size and length of the piezoresistors and the membrane dimensions under normal forces. Since the membranes were suspended, the normal force loading resulted in a small strain change in the membrane which is transferred to the piezoresistors. Consequently, a relative change in the output voltage from the sensor was observed.

Figure 17B:
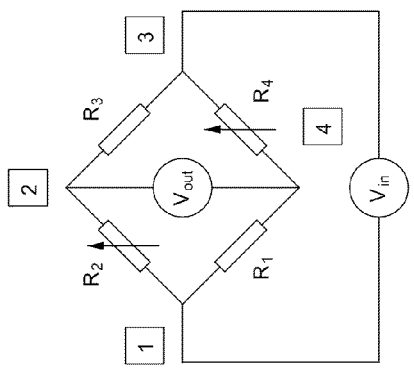
FIGS. 17A-17C show various schematics of a half-Wheatstone Bridge pressure sensors in accordance with another embodiment of the present invention.
Figure 17C:
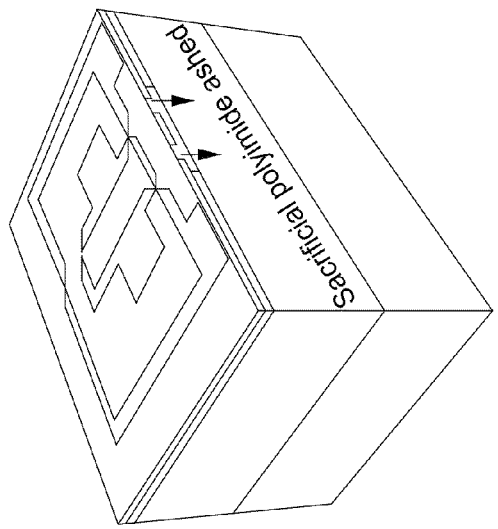
Figure 17A:
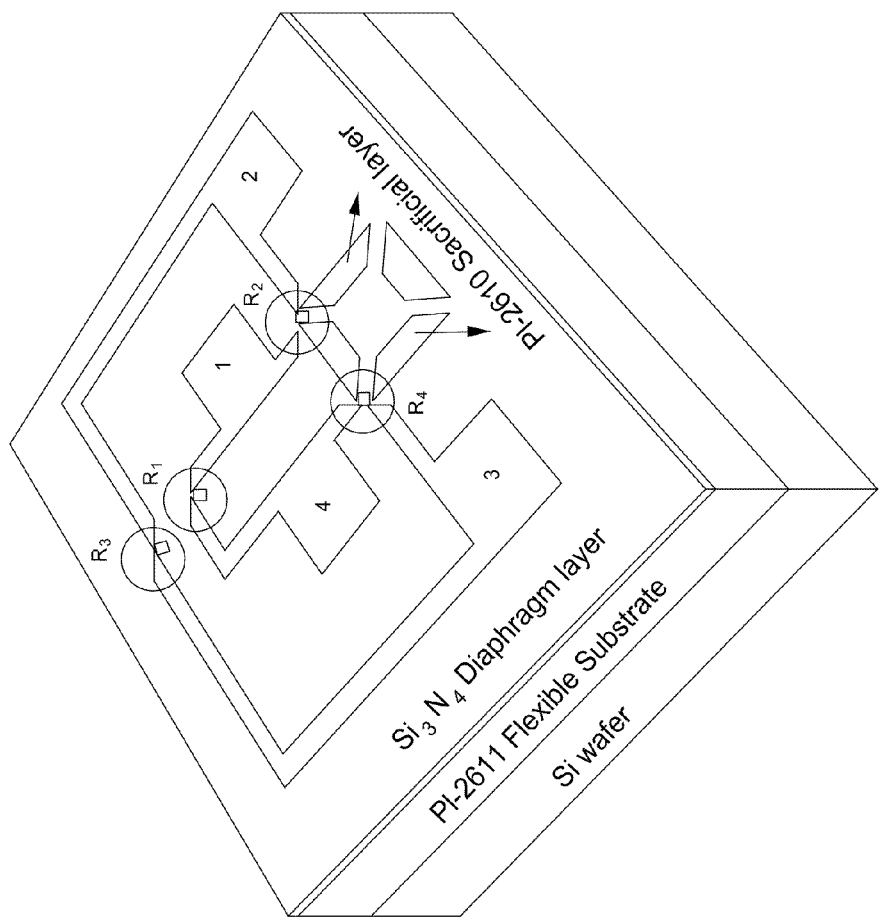

FIG. 17A shows a Coventor™ model for a non-micromachined pressure sensor depicting various layers connected in a half-Wheatstone Bridge configuration. FIG. 17B shows a circuit diagram of the pressure sensor with resistors $R_1$ and $R_3$ as passive (reference) resistors and $R_2$ and $R_4$ as active (piezo-) resistors. FIG. 17C shows a cross-section of the micromachined pressure sensor model obtained after removing the sacrificial polyimide PI-2611.

Figure 18:
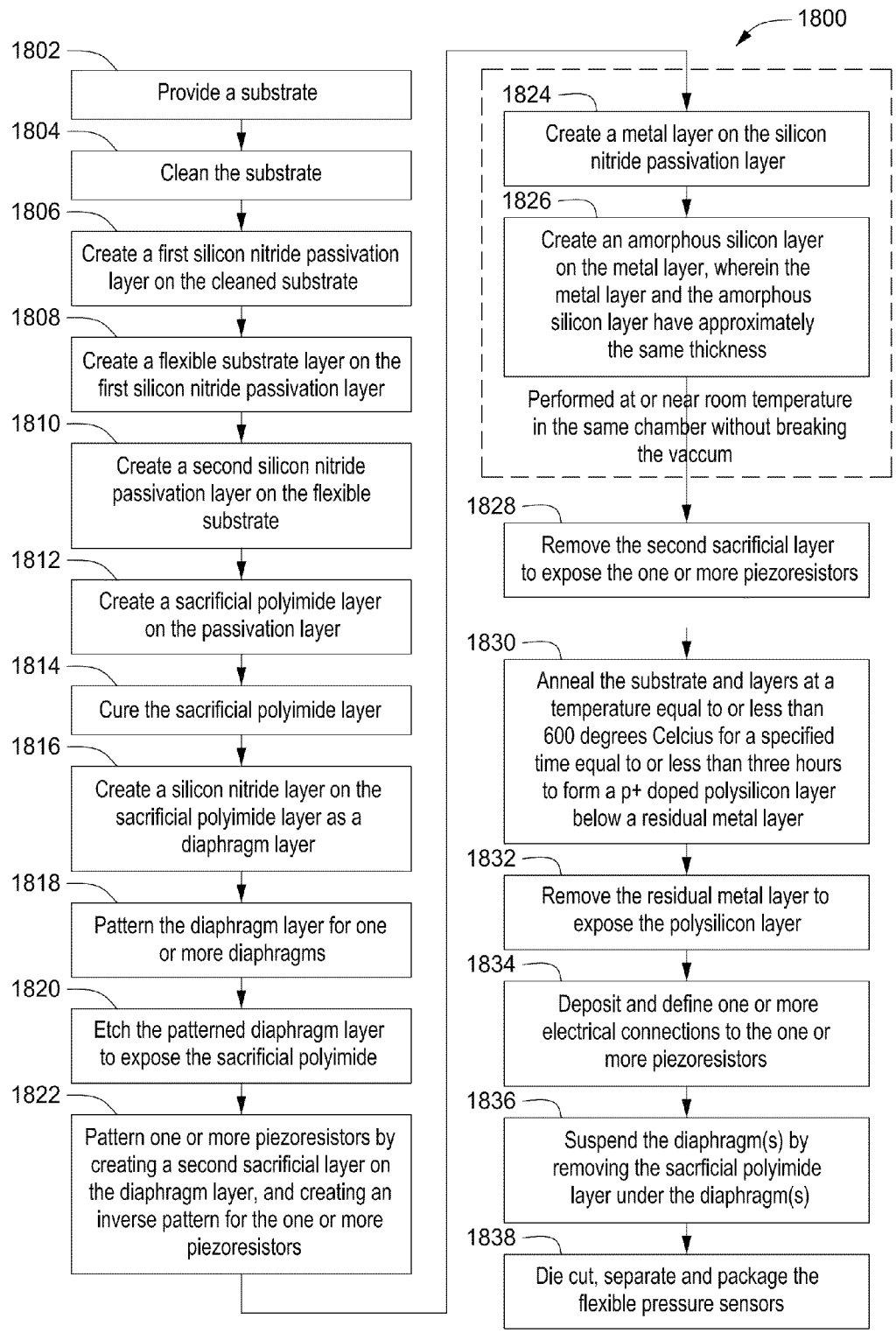
FIG. 18 is a flow chart depicting a fabrication process for pressure sensors in accordance with another embodiment of the present invention.

The fabrication steps of the pressure sensors in accordance with one embodiment of the present invention are shown in FIG. 18. The process 1800 begins by providing a substrate in block 1802, cleaning the substrate in block 1804 and creating a first silicon nitride passivation layer on the cleaned substrate in block 1806. A flexible substrate layer is created on the first silicon nitride passivation layer in block 1808 and a second silicon nitride passivation layer is created on the flexible substrate in block 1810. A first sacrificial polyimide layer is created on the second passivation layer in block 1812 and the first sacrificial polyimide layer is cured in block 1814. A silicon nitride layer is created on the first sacrificial polyimide layer as a diaphragm layer in block 1816 and the diaphragm layer is patterned for one or more diaphragms in block 1818. The patterned diaphragm layer is etched to expose the sacrificial polyimide in block 1820. One or more piezoresistors are patterned by creating a second sacrificial layer on the diaphragm layer and creating an inverse pattern for the one or more piezoresistors in block 1822. The next two steps are performed at or near room temperature in a chamber without breaking a vacuum or near-vacuum within the chamber: (a) creating a metal layer on the passivation layer in block 1824; and (b) creating an amorphous silicon layer on the metal layer in block 1826, wherein the metal layer and the amorphous silicon layer have approximately the same thickness. The second sacrificial layer is removed to expose the one or more piezoresistors in block 1828. The substrate and the layers are annealed at a temperature equal to or less than 600° C. and a period of time equal to or less than three hours to form a doped polysilicon layer below a residual metal layer in block 1830. The residual metal layer is removed to expose the doped polysilicon layer in block 1832 and one or more electrical connections to the one or more piezoresistors are deposited and defined in block 1834. The diaphragm(s) are suspended by removing the first sacrificial layer under the diaphragm(s) in block 1836 and the substrate is die cut, separated and the sensors are packaged in block 1836. Note that additional steps can be added or existing steps can be modified to create additional semiconductor devices or modify the pressure sensor.

More specifically and as an example, the process begins with $Si_3N_4$ passivated <100> P-type Si wafers. Polyimide PI-2611 was used as the sacrificial layer. A new curing profile for the polyimide was developed in order to ensure the survivability of the polyimide at elevated annealing temperatures. After spin-coating, PI-2611 was cured at 130° C. for 30 minutes, followed by a temperature ramp to 200° C. and cured for 30 minutes. The temperature was again ramped to 500° C. for a dwell time of 2 hours. This type of curing profile ensured higher thermal budget handling capacity for the sacrificial polyimide and also prevented film delamination. After curing, a final thickness of 2.0-2.4 µm of sacrificial layer is obtained. A 1.5 µm thick RF sputtered $Si_3N_4$ layer was then deposited as the diaphragm layer. The wafer was then patterned for windows in the diaphragm layer. The exposed $Si_3N_4$ on the wafer was removed by RIE in $CF_4$ plasma. This step exposed the sacrificial polyimide under the windows and facilitated its removal to suspend the diaphragm layer in the later stage. The wafer was then patterned for piezoresistors. First, a 0.5 µm thick Al film was deposited by RF sputtering, followed by RF sputtered 0.5 µm thick a-Si film. Lift-off was performed to pattern the double Al/a-Si film into the piezoresistors. The wafer was then annealed at 500° C. for 90 minutes in RTA in forming gas ambient Anneal time of 90 minutes was selected to ensure complete crystallization of the sample. As described in earlier section, the Si displaced Al to the top, which was subsequently etched away in the solution of Al-etch maintained at 55° C. for 120 secs, thus obtaining large-grained, p-type polysilicon resistors. Subsequently, electrical connections to the resistors were deposited and defined. The next step involved removal of the sacrificial polyimide PI-2611 to suspend the diaphragm. Ashing in $O_2$ plasma ensured effective removal of the sacrificial polyimide underneath the diaphragm and the bridge arms with anticipated undercut near the side walls.

FIG. 19A is an image of a pressure sensor comprised of a half-Wheatstone Bridge with two active polysilicon piezoresistors on a micromachined $Si_3N_4$ diaphragm and two passive resistors. FIG. 19B is an inset showing the individual resistor dimensions in accordance with one embodiment of the present invention. FIG. 19A illustrates the pressure sensor with piezoresistors on the bridge arms covered with gold, in order to protect them from oxidizing during ashing. Ashing was performed for 20+ hours for removing the sacrificial polyimide and suspending the diaphragm. Later gold was etched off using iodine: potassium iodide ($I_2$:KI) solution.

Figure 20:
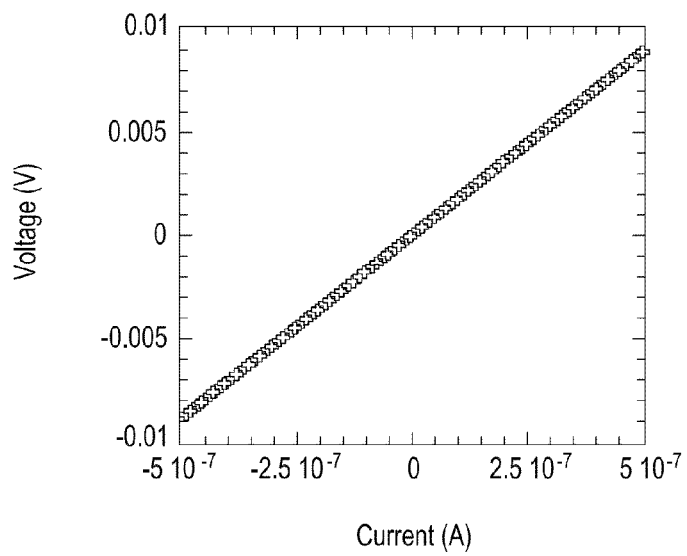
FIG. 20 is an IV characteristics for $R_2$ for the structure described in FIG. 19A.

The piezoresistors were individually bonded and their IV characteristics were measured. For a typical structure depicted in FIG. 19A, the $Si_3N_4$ diaphragm size is 80 µm×80 µm. Resistors, $R_2$ and $R_4$, which lie on the diaphragm bridge arms are active resistors as their resistances would change relatively with change in their strain values due to the normal displacement of the suspended diaphragm. Resistors, $R_1$ and $R_3$ which lie outside the diaphragm are passive resistors and are used for reference biasing. This implied that their resistances would not vary significantly when compared with the active resistors. Only the active resistor was considered in the analysis, $R_2$ in this case. Its IV characteristics are plotted in FIG. 20. The measured resistance is 17.6 KΩ. These values were observed to be compliant with the resistances values for the polysilicon thin film resistors obtained by other deposition processes. The electrical characterization results showed that the polysilicon film obtained by AIC exhibited good electrical conductivity.

Characterization of the polysilicon film for piezoresistive properties was carried out using Atomic Force Microscope (AFM) tip to exert pressure on the suspended diaphragm. Currently, Atomic Force Microscope (AFM) is extensively used for imaging, surface manipulation, and lithography in the field of nanotechnology and bioscience. In contact mode, AFM is commonly utilized for topographical imaging of the sample surface. The use of AFM in contact mode for normal force/pressure application to characterize and calibrate Microelectromechanical System-(MEMS-) based, surface-micromachined, piezoresistive pressure sensors will now be described. These sensors are unique in the sense that they are of miniature size and much more sensitive than the commonly used pressure sensors.

Previous literature on characterization of tactile sensors on micromachined diaphragms focused on the whole sensor or array enclosed by an elastomer mesa structure [7,76,77,78] to ensure uniform application of the load on the whole diaphragm surface. Then, by using a load-cell coupled to a probe-tip, normal forces were exerted on to the diaphragm. The use of an elastomer helps increase the contact surface area of the probe-tip on the sensor diaphragm and transforms the applied load to stress in a homogenous manner. Since the elastomer also absorbs part of the applied load, the elastomer top surface experiences a much larger load when compared to loads experienced by the bare diaphragm surface below. This facilitates the use of a larger load-cell thereby increasing the applied force range and therefore the probe tip radii. Our case, however, differs from these in that the sensor diaphragm can not be protected with an elastomer due to the specific use, thus necessitating application of a very small amount of force with high accuracy for sensor calibration.

Valdastri et. al. [79] summarized various multi-component force sensors with their dimensions and characterization methods along with their achieved applied force ranges. The sensing element sizes in the above cases were in the range of few hundreds of micrometers to millimeters. The fabricated sensor structures [80] have diaphragm sizes ranging from 40×40 µm² to 80×80 µm² and a maximum deflection of 1.5 µm. They consist of a suspended 1.5 µm thick silicon nitride ($Si_3N_4$) diaphragm with piezoresistive polysilicon resistors on the bridge arms connecting the diaphragm to the silicon substrate, in half-Wheatstone bridge configuration [56]. The schematic and 3-D solid Coventor™ model of one of the sensors are shown in FIG. 16A. When pressure is applied on the diaphragm, it results in a change in strain as experienced by the piezoresistors. This strain is subsequently transformed into a change in resistances of the piezoresistors which is measured by a low-noise, low current I-V measurement setup. The pressure sensor is designed for tactile sensing applications in the range of 0-50 KPa.

Figure 21:
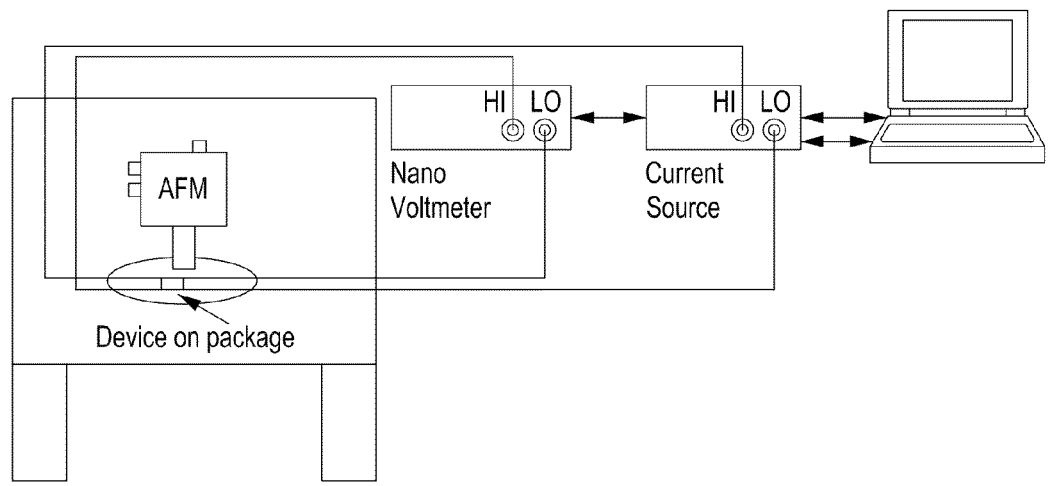
FIG. 21 is a schematic of pressure sensor characterization setup using AFM and IV measurement set-up.

The small size of the sensors together with their very high sensitivity required a new characterization set-up capable of applying small amounts of controlled force at precise locations. FIG. 21 illustrates the measurement set-up, which was designed and built, based on [7,77,78,79]. The system consisted of a tensile mono-axial 10 µm load-cell (GSO-10 from Transducers Techniques, Inc., USA) with a resolution of ±0.005 µm, and a customized probe-tip holder to facilitate use of probe-tips with varying radius. This was attached to a PI-620 ZCD Nanopositioner (Physik Instrumente, GmbH, Germany) with 0-50 µm Z-axis travel and a minimum resolution of 0.2 nm. A micromanipulator stage (Micromanipulator, Inc., USA) capable of moving in X, Y and Z-directions for coarse movement and a rotary tilt stage to tilt the sample from 0°-45° were utilized to hold the sample. In order to achieve pressure values down to the range of 0-50 KPa, the load-cell resolution was required to be between microgram to sub-milligram accuracy. In addition, in order to apply a uniform load on the diaphragm surface, it was required to use probe-tips with larger tip-radius. However, due to the unavailability of an accurate, inexpensive, compact load-cell with a microgram range load discernability for low pressure ranges and due to sensor diaphragm size restrictions, we were forced to explore options.

The use of a surface profiler for tactile sensor testing as described in [81] was also considered. Sample placement issues coupled with structure size and load range (few tens of milligrams) restrictions inhibited its use as the characterization tool. Another method to measure the applied load is by using electronic weight scale capable of sub-milligram resolution instead of a load-cell. This measures the change in overall weight increase as the sensor is probed in perpendicular direction [82]. However, this set-up is again limited by the diaphragm size, probe tip radius and weight variations due to environmental factors.

Use of AFM in the contact mode and studying of sample/probe-tip interactions through a force plot for sample hardness and indentation have been previously documented. We employed similar principles to characterize our pressure/force tactile sensor. Force plots present a graphical view of the probe tip and sample surface interactions as the tip proceeds to scan the surface. This representation provides a prediction of the sample hardness, elasticity and adhesion characteristics. It is also used to derive and control the contact force between the probe-tip and the sample [83,84]. The contact force F(N) is given by Hooke's Law in Eq. (4) as $$F = -kd \tag{4}$$

where, k (N/m) is the cantilever spring constant, and d(m) is the deflection of the cantilever. Since the probe-tip deflection can be accurately controlled by the AFM, smaller loads in the range of nN to µN can be applied [85,86].

Typically the AFM probe-tip used for surface imaging consists of a micromachined pyramidal shaped tip with a nominal radius of curvature of 10-50 nm [85,86]. In this case, the probe-tip contact force would be distributed in an area much smaller than the suspended $Si_3N_4$ diaphragm area of 80 µm×80 µm, as per the design specifications described in [56]. Therefore, to effectively increase the contact area of the probe-tip on the diaphragm surface, the tip was modified by attaching a spherical soda-lime glass particle of radius 25 µm to its end. Since soda-lime glass is a softer material compared to $Si_3N_4$, this reduced damage to the diaphragm surface and avoided undesirable indentations during contact. It also ensured uniform application of the load over a larger area of the diaphragm surface.

Resistor $R_2$ was connected in a typical four wire resistance measurement configuration to detect small changes in its resistance with change in applied pressure to the diaphragm. Veeco Instruments' Dimension 5000 AFM with NanoScope IIIA controller in contact mode was used with a modified probe-tip. In order to accurately calculate the contact force from Eq. (4), first the effective spring constant of the probe-tip with the attached particle was determined. In this case the probe-tip consisted of a rectangular silicon cantilever of 90 µm length, 35 µm width and 2 µm thickness, coated with a very thin layer of aluminum (Al) on the backside to obtain detector gain in contact mode. The probe-tip consisted of a soda-lime glass particle of 50 µm diameter attached to the end of rectangular Si cantilever with nominal values of spring constant, k (=14 N/m) and resonant frequency, $f_0$ (=315 KHz) [57]. This increases the contact surface area of the probe-tip on the diaphragm surface and also ensured uniform application of force on the suspended diaphragm. For simplification purposes, the particle was assumed to be attached at the end of the cantilever beam. The modified spring constant, k* for the probe-tip with spherical particle attached was found out by using Cleveland's formula [58,59]:

$$k^* = \frac{4 \cdot \pi^2 \cdot m}{\left(\left[\frac{1}{f_1^2} - \frac{1}{f_0^2}\right]\right)} \; N/m \tag{5}$$

where:
m (kg) is the mass of the rectangular Si cantilever without the particle;
$f_0$ (=315 KHz) is the resonant frequency of the probe-tip without the particle attached; and
$f_1$ (=209 KHz) is the resonant frequency of the probe-tip with the particle attached. Moreover, a tilt correction factor [60] had to be introduced to obtain the effective spring constant, $k_{eff}$:

$$k_{eff} = \frac{k^*}{\cos^2(12°)} \; N \tag{6}$$

Figure 22:
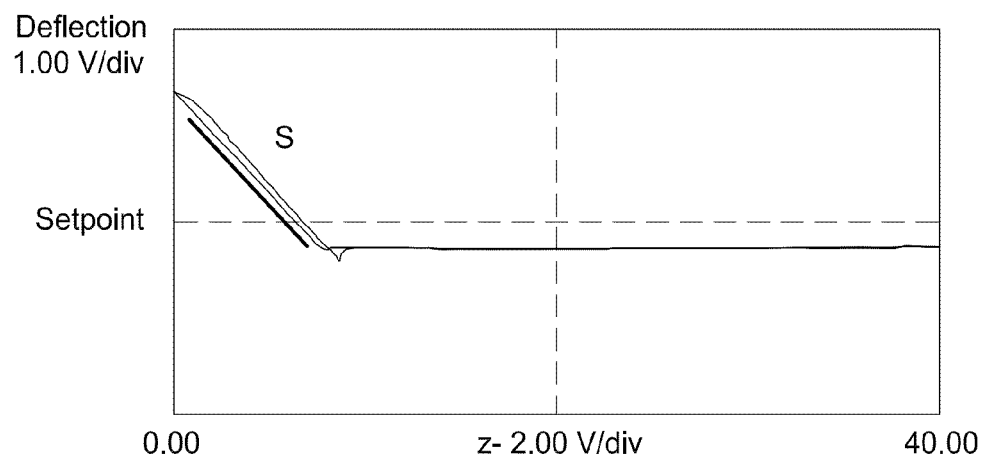
FIG. 22 is a force-plot obtained after engaging the probe-tip on the diaphragm in accordance with one embodiment of the present invention.

This calculation, however, assumes that the particle is a perfect sphere attached to the tip of the cantilever. Therefore, any effect on resonant frequency of the cantilever with respect to measured effective mass due to offset in length was considered negligible [89,90]. This factor compensated for the tilt introduced in the probe-tip with respect to the horizontal. $k_{eff}$ value of 11.51 N/m was calculated from Eq. (6). The force exerted by the probe-tip during each engage step, or contact force was changed by altering the trigger voltage, $T_v$ in the force mode. For each trigger voltage $T_v$ value ranging from 1V to 10 V, a force plot similar to FIG. 22 was obtained. The scan size was kept constant in each case, during each engagement with different trigger voltages. The slope of the force plot gave the deflection sensitivity, S in nm/V of the probe-tip. The force, F exerted by the probe-tip on the diaphragm was then calculated using [61]:

$$F = k_{eff} \times S \times T_v N \tag{7}$$

Assuming the contact area of the spherical particle touching the sample is given by a spheroid with an angle 40° with diameter, d and negligible amount of indentation occurring at the tip and sample interface, we predicted the applied pressure, P from:

$$P = \frac{4F}{\pi \cdot d^2 \cdot \sin^2(20°)} \; N/m^2 \tag{8}$$

Thus, the pressure applied by the probe-tip was found to be highly dependent on the material of the probe-tip, and its interactions with the $Si_3N_4$ diaphragm surface. For each engage step with different $T_v$, corresponding S values were noted, from which F and P were calculated. Normal pressures ranging from 1 KPa to 12 KPa were obtained. Once the force-plot was obtained for a particular $T_v$ value, a constant DC current ranging from −5.0 µA to +5.0 µA was simultaneously sourced through the resistor $R_2$. Corresponding change in its resistance was measured using the measurement set-up. The measured change in resistance (ΔR) is given by:

$$\Delta R = R_{T_v} - R_o \tag{9}$$

Figure 23:
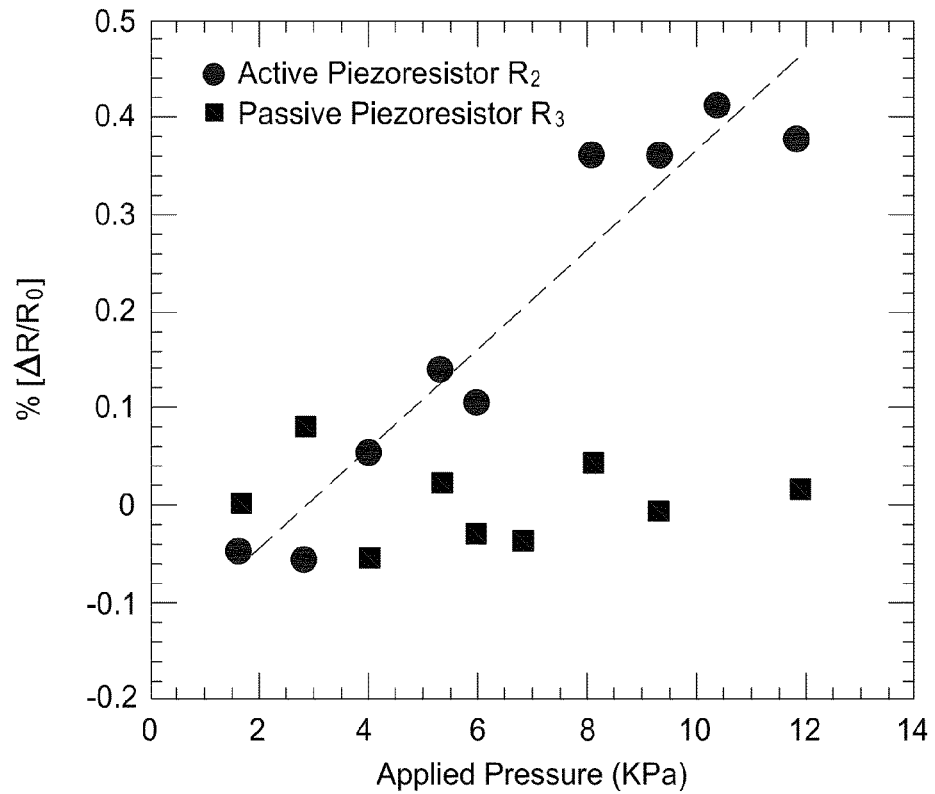
FIG. 23 is a plot showing the percentage of change in resistance with applied pressure for active and passive piezoresistors in accordance with one embodiment of the present invention.

Where, $R_{T_v}$ is the resistance measured for a particular trigger voltage and $R_o$ is the resistance when no pressure is applied to the diaphragm. $R_o$ value for the resistor $R_2$ measured from the set-up before the application of the force was $R_{02}$ (=18.103 KΩ). FIG. 23 shows the percentage change in the piezoresistance ($\Delta R/R_o$) for the active resistor $R_2$. Passive resistor $R_3$ was not affected by the AFM probe tip as it is not on the diaphragm. The resistance for the active resistor $R_2$ varies linearly from −0.1% to 0.5% with applied pressure, proving the piezoresistive property of the polysilicon film obtained by AIC. This ability to apply lower forces/pressure and being able to differentiate and measure small resistance changes greatly enhanced the characterization sensitivity.

Two fabricated pressure sensor structures, referred to as Device#1 and Device#2 here [80], were considered with varying $Si_3N_4$ diaphragm sizes of 80×80 μm² and 70×70 μM², respectively. The pressure sensor consisted of a suspended $Si_3N_4$ diaphragm with AIC polysilicon [92] resistors on the bridge arms, connected in half-Wheatstone bridge network, as shown in FIG. 24. The dimensions of an individual piezoresistor are as illustrated in the inset. Change in the applied pressure on the diaphragm brought about a strain change in resistors $R_2$ and $R_4$, the so-called active resistors, which resulted in a change in their corresponding resistances. $R_1$ and $R_3$ lied outside the diaphragm area and were only used as a reference. Hence, they were passive to the change in pressure. If all resistors are of equal value, the Wheatstone bridge would be balanced and the output voltage $V_{OUT}$ would be zero. the In order to relate the pressure applied on the diaphragm and its transformation into corresponding change in resistances of the piezoresistors, only resistor $R_2$ in each of pressure sensor structure was considered for current analysis.

Each sensor structure was first diced and was wire-bonded to individual packages. I-V characteristics before pressure application were carried out using a semiconductor analyzer Agilent 4155 C. The schematic of electrical connections is as shown in FIG. 21.

The bonded package was then glued onto a flat 150 mm bare Si wafer which acted as a base for mechanical support and was held on the AFM stage by vacuum. Care was taken to ensure that the sample was strongly held on to the base wafer restricting any movement. The probe-tip was brought close to the diaphragm surface. IV measurements before engaging the probe-tip were taken using the low-noise delta mode IV set-up [93], which consisted of combination of a Keithley low-noise Current Source 6221 and Keithley Nano-Voltmeter 2182A, controlled by a computer. The resistor was connected in four-wire resistance measurement set-up. The current was swept and corresponding voltages were measured. The resistance at zero applied pressure, $R_0$ of the piezoresistors before engaging the AFM probe-tip was obtained by taking the average of eleven such readings. A trigger voltage, $T_v$ (=1V) was used for the initial measurement. The probe-tip was then engaged on the center of the sample surface and the scan controlling parameters such as scan size and set-point were adjusted to obtain a good force-plot. The sensitivity factor, S was noted down for each trigger voltage value. The corresponding force values were obtained from the force-plot using Eqs. (4) and (5). During the force-plot capture, I-V measurements were carried out simultaneously to determine the change in the resistance due to applied load. $T_v$ was varied in steps of 1 V for each engagement (tapping). Care was taken not to disturb the probe-tip contact location on the diaphragm surface for each engagement step. Relative change in resistance %($\Delta R/R_0$) and corresponding pressure values for each trigger voltages ranging from 1V to 10 V were plotted.

Additional measurements were performed on $R_2$ of Device#1 comparing the effect of probe-tip engagement on the change in its resistance. In this case, the pressure was applied on the diaphragm without lifting the probe-tip. The probe-tip was engaged only once (continuous case) and the pressure was varied in each step by increasing $T_v$ by 1V without disengaging the AFM. Corresponding force-plots were obtained and relative change in resistance ($\Delta R/R_0$) was measured.

Figure 25:
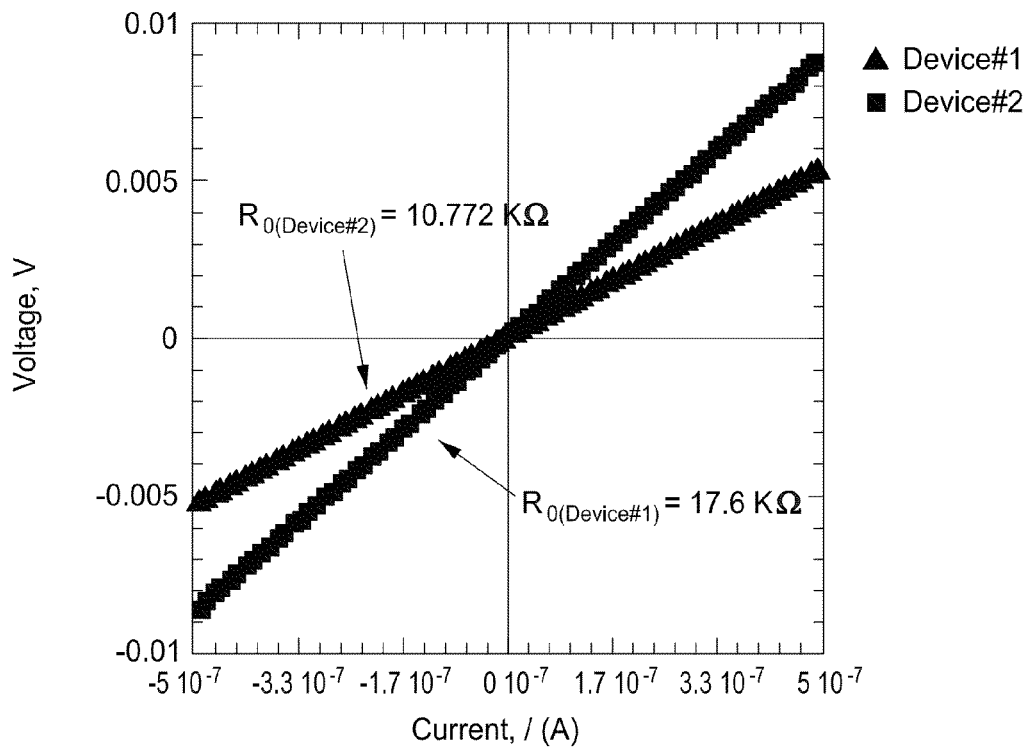
FIG. 25 is a plot of the I-V characteristics measured by Agilent 4155 C for Device#1 and Device#2 with no applied pressure in accordance with one embodiment of the present invention.

For piezoresistor $R_2$ of each Device#1 and Device#2, DC current was swept from −0.5 μA to +0.5 μA using Agilent 4155C and corresponding voltages were plotted as in FIG. 25. Average resistance value of 17.6 KΩ and 10.772 KΩ were measured. Before proceeding to pressure characterization using an AFM, a DC current in the range of −0.1 μA to +0.1 μA was applied with the Keithley Delta-Mode System described earlier. The measured resistance with no applied pressure was $R_{0(Device\#1)}$=18.103 KΩ) and $R_{0(Device\#}2)$=10.412 KΩ. Pressure was then applied on the diaphragm by engaging the AFM on its surface, as described in the previous section. The measured resistance value for each trigger voltage was denoted as $R_{Loaded}$. Then the relative change in resistance due to applied pressure was calculated as $\Delta R/R_0 = R_{Loaded} - R/R_0$.

The relative change in resistance varied from −0.05% to 0.4% for pressure ranges of 1.6 KPa to 12 KPa as shown in FIG. 8 for Device#1. Similarly, for device Device#2, this change varied from 0.18% to 1.31% for pressure ranges of 1.1 KPa to 10 KPa. This showed that for similar dimensions of resistors as described in FIG. 24, Device#2 with diaphragm size of 70×70 μm² was more sensitive compared to Device#1 with diaphragm size of 80×80 μm². Also low pressure ranges in the range of tens of KPa were achieved by this process. This experiment also provided with the proof for ascertaining the piezoresistive property of the polysilicon resistors obtained by AIC of amorphous Si.

Figure 27:
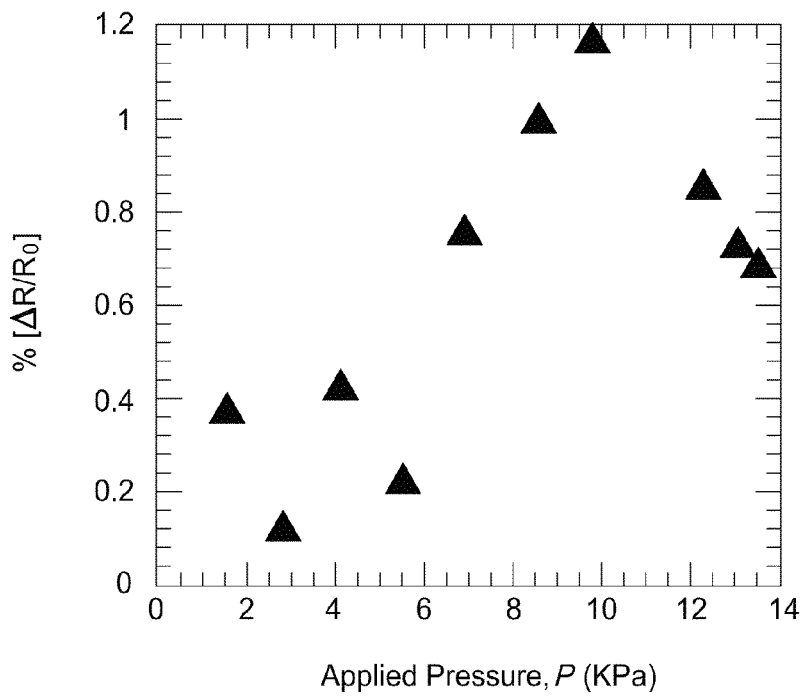
FIG. 27 is a plot of % ($\Delta R/R_0$) versus applied pressure, P (KPa) for Device#1 for continuous engagement case in accordance with one embodiment of the present invention.

In the second set of experiments, where the probe tip was continuously engaged on the diagram, %($\Delta R/R_0$) exhibited a larger spread for $R_2$ of Device#1 as shown in FIG. 27, although the general trend was similar to that found in the previous (tapping) experiment, where the tip engagement was not continuous. Since k and $T_v$ were constant in both continuous engagement and tapping cases, it is possible to compare the S values for Device#1 as depicted in Table III:

TABLE III

| Trigger Voltage | Sensitivity Factor S (nm/V) | |
|---|---|---|
| $T_v$ (V) | Continuous Engagement | Tapping Engagement |
| 1 | 28.00 | 32.25 |
| 2 | 27.66 | 27.96 |
| 3 | 28.11 | 26.50 |
| 4 | 27.67 | 26.50 |
| 5 | 28.14 | 23.79 |
| 6 | 28.96 | 22.74 |
| 7 | 28.35 | 23.20 |
| 8 | 31.22 | 23.37 |
| 9 | 28.87 | 23.16 |
| 10 | 27.07 | 23.80 |

The S values obtained for continuous case were quite close to each other as the probe-tip always interacted with a particular area of contact on the diaphragm surface. However for tapping, during each engagement step there could be the possibility of small offsets in the area of contact. This would add to a small source of error in measuring the pressure. These results showed considerable and linear $\Delta R/R_0$ changes at low pressure ranges in the case of tapping engagement of the AFM probe-tip as previously described.

The use of AFM as a MEMS piezoresistive pressure sensor characterization tool has been described. The AFM was used in contact mode by means of force-plots to calculate the amount of force exerted by the probe-tip on the surface-micromachined diaphragm surface. Two active piezoresistors lying on the diaphragm bridge arms were considered for characterization purposes. These devices differed only in the size of their suspended diaphragm structures. A linear change was observed in their resistance due to small changes in pressure applied on their diaphragm. The magnitude of applied pressure greatly depended on the interactions between the diaphragm surface and the probe-tip. Using a modified probe-tip with a 25 μm radius attached spherical particle, low pressure ranges down to tens of KPa have been obtained. A sensitive electrical characterization set-up has been demonstrated for effective measurement of small changes in voltage and current flowing through the piezoresistors during AFM tip engagement and scan steps. This facilitated dynamic measurement of response from pressure sensors with varying applied force, down 0.05% piezoresistance change.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

REFERENCES

[1] P. J. French, and A. G. R. Evans, "Piezoresistance in polysilicon and its applications to strain gauges", Solid State Elect., vol. 32, pp. 1-10 (1989).

[2] O. J. Gregory, T. You, Proceedings. IEEE Sensors 2003 2, 801 (2003).

[3] J. Thaysen, A. D. Yalcinkaya, R. K. Vestergaard, S. Jensen, M. W. Mortensen, P. Vettiger, A. Menon, 15th Intl. Conf. MEMS 2002, 320 (2002).

[4] M. Tamborin, S. Piccinini, M. Prudenziati, B. Morten, Sensors and Actuators A: Physical, 58, 159 (1997).

[5] A. Yamamoto, N. Nawachi, T. Tsutsumoto, A. Terayama, Diamond & Related Matls. 14, 657 (2005).

[6] H. Chiriac, M. Urse, F. Rusu, C. Hison, M. Neagu, Sensors and Actuators 76, 376 (1999).

[7] J. Engel, J. Chen, C. Liu, J. Micromech. Microeng. 13, 359 (2003).

[8] C. M. Wang, J. H. Hsieh, C. Li, Thin Solid Films 469-470, 455 (2004).

[9] J. Richter, O. Hansen, A. Nylandsted Larsen, J. Lundsgaard Hansen, G. F. Eriksen, E. V. Thomsen, Sensors and Actuators A: Physical 123-124, 388 (2005).

[10] W. D. Edwards, R. P. Beaulieu, J Scientific Instrumts. 2, 613 (1969).

[11] E. Peiner, A. Tibrewala, R. Bandorf, S. Biehl, H. Luthje, L. Doering, Sensors and Actuators A: Physical 130-131, 75 (2006).

[12] R. He, P. Yang, Nature Nanotechnol. Letts. 1, 42 (2006).

[13] J. J. Wortman, R. A. Evans, J. of Appl. Phys. 36, 153 (1965).

[14] C. Malhaire, D. Barbier, Thin Solid Films 427, 362 (2003).

[15] L. Cao, T. S. Kim, S. C. Mantell, D. L. Polla, Sens. and Actuators A 80, 273 (2000).

[16] K. H. L. Chau, C. D. Fung, P. R. Harris, G. A. Dahrooge, Electron Dev. Meeting, Int. Technical Digest, 761 (1991).

[17] E. Obermeir, P. Kopystnski, Sens. and Actuators A 30, 149 (1992).

[18] V. Mosser, J. Suski, J. Goss, E. Obermeier, Sens. and Actuators A 28, 113 (1991).

[19] M. Le Berre, M. Lemiti, D. Barbier, P. Pinard, J. Cali, E. Butarret, J. Sicart, J. L. Robert, Sens. and Actuators A 46-47, 166 (1995).

[20] A. Stoffel, A. Kovacs, W. Kronast, B. Muller, J. Micromech. Microeng. 6, 1 (1996).

[21] J. D. Gu, P. L. Chen, Thin Solid Films 498, 2 (2006).

[22] D. Sands, G. Williams, P. H. Key, Semicond. Sci. Tech. 12, 750 (1997).

[23] P. M. Smith, P. G. Carey, T. W. Sigmon, Appl. Phys. Lett. 70, 342 (1997).

[24] C. Yi, S. W. Rhee, J. H. Ju, S. K. Yim, H. Min, J. Matl. Sci.: Matl. In Electronics, 12, 697 (2001).

[25] Y. C. Peng, G. S. Fu, W. Yu, S. Q. Li, Y. L. Wang, Semicond. Sci. Tech. 19, 759 (2004).

[26] M. Hatano, S. Moon, M. Lee, K. Suzuki, C. P. Grigoropoulos, J. of Appl. Phys. 87, 36 (2000).

[27] T. Voustas, Low Temp. Polysilicon Tech. for Advanced Display Systems, 51, Sharp Microelec. Tech. Inc., 1997.

[28] G. Ekanayake, and H. S. Reehal, "Poly-silicon thin films by aluminum induced crystallization of microcrystalline silicon", Vacuum, vol. 81, pp. 272-278 (2006).

[29] 0. Nast, and A. J. Hartmann, "Influence of interface and Al structure on layer exchange during aluminum-induced crystallization of amorphous silicon", J. Appl. Phys., vol. 88, pp. 716-724, 2000.

[30] S. C. Yang, H. Suematsu, W. Jiang, K. Yatsui, IEEE Trans. on Plasma Sci. 30, 1816 (2002).

[31] W. Jiang, S. Kitayama, T. Suzuki, K. Yatsui, Pulsed Power Plasma Sci., 376 (2001).

[32] I. Obieta, F. J. Garcia, Sens. and Actuators A 41-42, 685 (1994).

[33] T. Abe, M. L. Reed, IEEE Proceedings. MEMS' 96, 258 (1996).

[34] J. Shirafuji, H. Matsui, A. Narukawa, Y. Inuishi, Appl. Phys. Lett. 41, 535 (1982).

[35] Y. Mishima, M. Takei, T. Uematsu, N. Matsumuto, T. Katehi, U. Wakino, M. Okabe, J. Appl. Phys. 78, 217 (1995).

[36] T. Ichikawa, Method of production of semiconductor substrate, U.S. Pat. No. 6,022,458, February 2000.

[37] Y. H. Jang, W. S. Park, M. Takeya, G. S. Jong, T. Ohmi, J. Eelctrochem. Soc. 144, 3973 (1997).

[38] J. Joo, J. Vac. Sci. Technol. A 18, 2006 (2000).

[39] P. Reining, B. Selle, F. Fenske, W. Fuhs, V. Alex, M. Birkholz, J. Vac. Sci. Technol. A 20, 2004 (2002).

[40] K. Xu, S. I. Shah, D. Guerin, J. Vac. Sci. Technol. A 19, 1078 (2001).

[41] K. Xu, M. M. Waite, S. I. Shah, Mats. Sci. & Engg. B 108, 281(2004).

[42] D. Dimova-Malinovska, O. Angelov, M. Sendova-Vassileva, M. Kamenova, J.-C. Pivin, Thin Solid Films 451-452, 303 (2004).

[43] M. S. Hague, H. A. Naseem, and W. D. Brown, "Interaction of aluminum with hydrogenated amorphous silicon at low temperatures", J. Appl. Phys., vol. 75, pp. 3928-3935 (1994).

[44] PI-2600 Series—Low Stress Polyimides, Technical Information, HD Microsystems, 250 Cheesequake Road, Parlin, N.J. 00859, USA, www.hdmicrosystems.com.

[45] D. Dimova-Malinovska, V. Grigorov, M. Nikolaeva-Dimitrova, O. Angelov, and N. Peev, "Investigation of structural properties of poly-Si thin films obtained by aluminum induced crystallization in different atmospheres", Thin Solid Films, vol. 501, pp. 358-361 (2006).

[46] S. Gall, M. Muske, I. Sieber, O. Nast, W. Fuhs, J. of Non-Crystalline Solids, 299-302 741(2002).

[47] S. Vijayalakshmi, Z. Iqbal, M. George, 1. Fefereci, H. Grebel, "Characterization of laser ablated thin films", Elsevier Thin Solid Films, Vol. 339, 1999, pp: 102-108. Third Report.

[48] S. K. Patil, Z. Çelik-Butler, D. P. Butler, 8th IEEE Nanotechnol. Conf. Proceedings., 767 (2008).

[49] O. Nast, and S. R. Wenham, "Elucidation of the layer exchange mechanism in the formation of polycrystalline silicon by aluminum-induced crystallization", J. Appl. Phys., vol. 88, pp. 124-132 (2000).

[50] S. Gall, 1. Schneider, 1. Klein, K. Hubener, M. Muske, B. Rau, E. Conrad, 1. Seiber, K. Petter, K. Lips, M. Stoger-Pollach, P. Schattschneider, W. Fuhs, "Large-grained polycrystalline silicon on glass for thin-film solar cells", Elsevier Thin Solid Films, Vol. 511-512, 2006, pp: 7-14.

[51] Y. Matsumoto, Z. Yu, Jpn. J. Appl. Phys. 40, 2110 (2001).

[52] H. Kim, D. Kim, G. Lee, D. Kim, S. H. Lee, Solar Energy Matls. & Solar Cells 74, 323 (2002).

[53] P. I. Widenborg, A. G. Aberle, J. of Crystl. Growth 242, 270 (2002).

[54] C. Ornaghi, G. Beaucarne, J. Poortmans, J. Nijs, R. Mertens, Thin Solid Films, 451-452, 476 (2004).

[55] I. Sieber, R. Schneider, I. Doerfel, P. Schubert-Bischoff, S. Gall, W. Fuhs, Thin Solid Films 427, 298 (2003).

[56] V. Shamanna, S. Das, Z. Çelik-Butler, D. P. Butler, and K. L. Lawrence, "Micromachined integrated pressure-thermal sensors on flexible substrates", J. Micromech. Microengg., vol. 16, pp: 1984-1992, 2006.

[57] Novascan Technologies, Inc., 131 Main Street, Ames, Iowa 50010, USA, www.novascan.com.

[58] J. P. Cleveland, S. Manne, D. Bocek, P. K. Hansma, Rev. Sci. Instrum. 64 (2), 403 (1993).

[59] R. Proksch, Technical Note, Asylum Research, 6310 Hollister Ave., Santa Barbara, Calif. 93117, USA, www.asylumresearch.com.

[60] B. Ohler, Application Note, Veeco Instruments Inc., www.veeco.com.

[61] W. Han, F. M. Serry, Application Note, Agilent Technologies, 5301 Stevens Creek Blvd, Santa Clara, Calif. 95051, USA, www.agilent.com.

[62] P. J. French, "Polysilicon: a versatile material for Microsystems", Sens. and Act. A, vol 0.99, pp. 3-12, 2002.

[63] J. Klein, J. Schneider, M. Muske, S. Gall, W. Fuhs, "Aluminum-induced crystallization of amorphous silicon: the influence of the aluminum layer on the process", 19th European Photovoltaic Solar Energy Conference, 7-11 Jun. 2004, Paris, France.

[64] S. Gall, M. Muske, 1. Seiber, 1. Schneider, O. Nast, W. Fuhs, "Polycrystalline silicon on glass by aluminum-induced crystallization", 29th IEEE Photovoltaic Specialists Conference, 19-24 May 2002, pp: 1202-1205.

[65] A. Sarikov, J. Schneider, M. Muske, I. Sieber, and S. Gall, "A model of preferential (100) crystal orientation of Si grains grown by aluminum-induced layer-exchange process", Thin Solid Films, vol. 515, pp. 7465-7468, 2007.

[66] E. Pihan, A. Slaoui, and C. Maurice, "Growth kinetics and crystallographic properties of polysilicon thin films formed by aluminum-induced crystallization", J. Crystl. Growth, vol. 305, pp. 88-98, 2007.

[67] D. He, J. Y. Wang, E. J. Mittemeijer, Appl. Surface Sci. 252 (2006) 5470-5473

[68] D. He, J. Y. Wang, and E. J. Mittemeijer, "Reaction between amorphous Si and crystalline Al in Al/Si and Si/Al bilayers: microstructural and thermodynamic analysis of layer exchange", J. Appl. Phys. A, vol 80, pp. 501-509, 2005.

[69] S. Gupta, H. Chelawat, A. A. Kumbhar, S. Adhikari, R. O. Dusane, Thin Solid Films. 516 (2008) 850-852

[70] H. Chelawat, A. Kumbhar, S. Adhikari, H. Kelkar, R. O. Dusane, Low temperature Aluminum induce crystallization process to bet Polysilicon films for thin film transistor application in active matrix displays, Proc. of ASID '06, 8-12 October New Delhi (2006).

[71] United States Patent Application No. 20090176018: Nano/micro-textured surfaces and methods of making same by aluminum-induced crystallization of amorphous silicon.

[72] U.S. Pat. No. 7,202,143: Low temperature production of large-grain polycrystalline semiconductors.

[73] G. Ekanayake, T. Quinn, and H. S. Reehal, "Large-grained poly-silicon thin films by aluminum-induced crystallization of microcrystalline silicon", J. Crystal Growth, vol. 293, pp. 351-358 (2006).

[74] P. K. Shetty, N. D. Theodore, J. Ren, J. Menendez, H. C. Kim, E. Misra, J. W. Mayer, and T. L. Alford, "Formation and characterization of silicon films on flexible polymer substrates", Matls. Letts., vol. 59, pp. 872-875, 2005.

[75] D. Van Gestel, I. Gordon, L. Camel, K. Van Nieuwenhuysen, J. D'Haen, J. Irigoyen, G. Beaucarne, and J. Poortmans, "Influence of seed layer morphology on the epitaxial growth of polycrystalline-silicon solar cells", Thin Solid Films, vol. 511-512, pp. 35-40, 2006.

[76] B. J. Kane, M. R. Cutkosky, G. T. A. Kovacs, Sensors and Actuators A 54 (1996) 511

[77] B. J. Kane, M. R. Cutkosky, G. T. A. Kovacs, J. Microelectromech. Sys. 9 (4) (2000) 425

[78] L. Wang, D. J. Beebe, IEEE Trans. Biomed. Engg. 49 (11) (2002) 1340

[79] P. Valdastri, S. Roccella, L. Beccai, E. Cattin, A. Menciassi, M. C. Carrozza, P. Dario, Sensors and Actuators A 123-124 (2005) 249

[80] S. K. Patil, Z. Ç elik-Butler, D. P. Butler, J. Vacuum Sci. Tech. B—Submitted

[81] A. Wisitsoraat, V. Patthanasetakul, T. Lomas, A. Tuantranont, Sensors and Actuators A 139 (2007) 17

[82] C.-S. Park, J. Park, D.-W. Lee, Microelectron. Eng. (2009)—Article in Press

[83] G. Kaupp, Atomic Force Microscopy, Scanning Nearfield Optical Microscopy and Nanoscratching: Application to Rough and Natural Surfaces, Springer, Berlin, 2006

[84] M. Sakai, Principles and Applications of Indentation, in: F. Yang, J. C. M. L (Eds.), Micro and Nano Mechanical Testing of Materials and Devices, Springer, New York, 2008, pp. 1-47

[85] C. B. Prater, P. G. Maivald, K. J. Kjoller, M. G. Heaton, Probing Nano-Scale Forces with Atomic Force Microscope: Application Note, www.veeco.com

[86] C. S. Hodges, Adv. Colloid. And Interface Sci. 99 (2002) 13

[87] M. Torotonese, IEEE Eng. in Med. and Biol. Mag. 16 (2) (1997) 28

[88] http://www.veecoprobes.com/c-29-contact.aspx

[89] NovaScan Technologies Inc., 131 Main Street, Ames, Iowa 50010, U.S.A, Tel:1 800-303-1265, www.novascan.com

[90] M. R. Vanlandingham, S. H. McKnight, G. R. Palmese, R. F. Eduljee, J. W. Gillespie, Jr., R. L. McCulough, J Mat. Sci. Letts. 16 (1997) 117

[91] R. Proksch, Nondestructive Added Mass Spring Calibration with the MFD-3DTM: Technical Note, www.asylumresearch.com

[92] W. Han, Force Spectroscopy with the Atomic Force Microscope: Application Note, www. agilent.com

[93] 0. Nast, A. J. Hartmann, J. Appl. Phys. 88 (2000) 716

[94] A. Daire, Low-Voltage Measurement Techniques: Application Note, www.keithley.com.

What is claimed is:

1. A semiconductor device disposed on a substrate wherein the semiconductor device comprises one or more elements containing a piezoresistive polysilicon fabricated by a process comprising the steps of:
providing the substrate having a passivation layer;
performing, at or near room temperature in a vacuum chamber without breaking a vacuum or near-vacuum within the chamber, the steps of: (a) creating a metal layer on the passivation layer, and (b) creating an amorphous silicon layer on the metal layer, wherein the metal layer and the amorphous silicon layer have approximately the same thickness;
annealing the substrate, the passivation layer, the metal layer and the amorphous silicon layer at a temperature equal to or less than 600° C. and a period of time equal to or less than three hours to form a doped polysilicon layer below a residual metal layer, wherein the doped polysilicon layer is above the passivation layer; and
removing the residual metal layer to expose the doped polysilicon layer having one or more piezoresistive properties.

2. The semiconductor device as recited in claim 1, wherein the step of providing the substrate having the passivation layer comprises the steps of:
providing the substrate; and
creating the passivation layer on the substrate.

3. The semiconductor device as recited in claim 2, further comprising the step of creating one or more layers between the substrate and the passivation layer.

4. The semiconductor device as recited in claim 3, wherein the step of creating the one or more layers between the substrate and the passivation layer comprises the steps of:
creating a first silicon nitride passivation layer on the substrate;
creating a flexible substrate layer on the first silicon nitride passivation layer; and
creating a second silicon nitride passivation layer on the flexible substrate layer.

5. The semiconductor device as recited in claim 1, further comprising the steps of:
performing one or more steps to fabricate one or more semiconductor devices;
creating one or more electrodes connected to the one or more semiconductor devices; and
dicing the substrate and packaging the diced substrate.

6. The semiconductor device as recited in claim 1, wherein the steps of annealing the substrate, the passivation layer, the metal layer and the amorphous silicon layer are performed without any additional annealing steps or doping steps.

7. The semiconductor device as recited in claim 1, further comprising the step of fabricating one or more force or pressure sensors using the doped polysilicon layer.

8. The semiconductor device as recited in claim 1, wherein the steps of creating the metal layer and the amorphous silicon layer are performed using RF Sputtering, Thermal Evaporation, E-beam Evaporation, Hot-Wire Chemical Vapor Deposition (HWCVD) and Low Pressure Chemical Vapor Deposition (LPCVD).

9. The semiconductor device as recited in claim 1, wherein step of creating the amorphous silicon layer is performed immediately after the step of creating the metal layer.

10. The semiconductor device as recited in claim 1, wherein annealing step is performed in the presence of a forming gas.

11. The semiconductor device as recited in claim 10, wherein the annealing step is performed in the presence of the forming gas comprising Ar, Kr, $N_2$, $H_2$, $H_2O$, CO, $CO_2$ or a combination thereof.

12. The semiconductor device as recited in claim 10, wherein the annealing step is performed in the presence of the forming gas comprising approximately 98% $N_2$ and 2% $H_2$.

13. The semiconductor device as recited in claim 1, wherein:
the step of providing the substrate includes a substrate material comprising silicon, silicon wafer, polyimide flexible substrate, glass, indium antimonide, GaAs, GaN, CdSe, SiC, CdTe, CdHgTe, or ZnS;
the step of providing the substrate having the passivation layer includes a passivation material comprising silicon nitride, zinc sulfide, silicon oxide, or any combinations thereof;
the step of creating the metal layer is performed using a metal comprising Al, Ni, Au, Ag, Cu, Cr, Co, Fe, Pt, Ti, Zn, Pd, and alloys thereof;
the step of creating the metal layer and the amorphous silicon layer results in a thickness of the metal layer and the amorphous silicon layer each greater than or equal to 0.5 μm;
the step of annealing the substrate and the layers is performed at the annealing temperature between approximately 300° C. and 575° C. and the period of time between approximately 30 minutes and 90 minutes.

14. The semiconductor device as recited in claim 1, wherein the step of annealing the substrate and the layers is performed at the annealing temperature between approximately 400° C. and 500° C. and the period of time less than or equal to 60 minutes.

15. The semiconductor device as recited in claim 1, wherein the step of annealing the substrate and the layers is performed at the annealing temperature between approximately 300° C. and 550° C. and the period of time less than or equal to 90 minutes.

16. The semiconductor device as recited in claim 1, wherein the steps of providing the substrate, creating the metal layer, creating the amorphous silicon layer, annealing the substrate and the layers, and removing the residual metal layer are performed after a CMOS process.

17. The semiconductor device as recited in claim 1, wherein the steps of providing the substrate, creating the metal layer, creating the amorphous silicon layer, annealing the substrate and the layers, and removing the residual metal layer fabricate two or more semiconductor devices.

18. The semiconductor device as recited in claim 17, further comprising the step of cutting, separating and packaging the two or more semiconductor devices.

19. A force or pressure sensor disposed on a substrate wherein the force or pressure sensor is fabricated by a process comprising the steps of:
providing the substrate having a passivation layer;
creating a sacrificial polyimide layer on the passivation layer;
curing the sacrificial polyimide layer;
creating a silicon nitride layer on the sacrificial polyimide layer as a diaphragm layer;
patterning the diaphragm layer for one or more diaphragms;
etching the patterned diaphragm layer to expose the sacrificial polyimide;
patterning one or more piezoresistors by creating a second sacrificial layer on the diaphragm layer and creating an inverse pattern for the one or more piezoresistors;
performing, at or near room temperature in a vacuum chamber without breaking a vacuum or near-vacuum within the chamber, the steps of: (a) creating a metal layer on the passivation layer, and (b) creating an amorphous silicon layer on the metal layer, wherein the metal layer and the amorphous silicon layer have approximately the same thickness;
removing the second sacrificial layer to expose the one or more piezoresistors;
annealing the substrate and the layers at a temperature equal to or less than 600° C. and a period of time equal to or less than three hours to form a doped polysilicon layer below a residual metal layer, wherein the doped polysilicon layer is above the passivation layer;
removing the residual metal layer to expose the doped polysilicon layer;
depositing and defining one or more electrical connections to the one or more piezoresistors; and
suspending the diaphragm(s) by removing the sacrificial polyimide layer under the diaphragm(s).

20. The force or pressure sensor as recited in claim 19, wherein the step of providing the substrate having a passivation layer comprises the steps of:
providing the substrate; and
creating the passivation layer on the substrate.

21. The force or pressure sensor as recited in claim 20, further comprising the step of creating one or more layers between the substrate and the passivation layer.

22. The force or pressure sensor as recited in claim 21, wherein the step of creating the one or more layers between the substrate and the passivation layer comprises the steps of:
creating a first silicon nitride passivation layer on the substrate;
creating a flexible substrate layer on the first silicon nitride passivation layer; and
creating a second silicon nitride passivation layer on the flexible substrate layer.

23. The force or pressure sensor as recited in claim 19, wherein the steps of creating the metal layer and the amorphous silicon layer are performed using RF Sputtering, Thermal Evaporation, E-beam Evaporation, Hot-Wire Chemical Vapor Deposition (HWCVD) and Low Pressure Chemical Vapor Deposition (LPCVD).

24. The force or pressure sensor as recited in claim 19, wherein the step of creating the amorphous silicon layer is performed immediately after the step of creating the metal layer.

25. The force or pressure sensor as recited in claim 19, wherein the step of annealing the substrate and the layers is performed at the annealing temperature between approximately 400° C. and 500° C. and the period of time less than or equal to 60 minutes.

26. The force or pressure sensor as recited in claim 19, wherein the step of annealing the substrate and the layers is performed at the annealing temperature between approximately 300° C. and 550° C. and the period of time less than or equal to 90 minutes.

27. The force or pressure sensor as recited in claim 19, wherein annealing step is performed in the presence of a forming gas.

28. The force or pressure sensor as recited in claim 27, wherein the annealing step is performed in the presence of the forming gas comprising Ar, Kr, $N_2$, $H_2$, $H_2O$, CO, $CO_2$ or a combination thereof.

29. The force or pressure sensor as recited in claim 27, wherein the annealing step is performed in the presence of the forming gas comprising approximately 98% $N_2$ and 2% $H_2$.

30. The force or pressure sensor as recited in claim 19, wherein the all of the steps fabricate two or more force or pressure sensors.

31. The force or pressure sensor as recited in claim 30, further comprising the step of cutting, separating and packaging the two or more force or pressure sensors.

* * * * *